US010756186B2

(12) United States Patent
Chen et al.

(10) Patent No.: US 10,756,186 B2
(45) Date of Patent: Aug. 25, 2020

(54) THREE-DIMENSIONAL MEMORY DEVICE INCLUDING GERMANIUM-CONTAINING VERTICAL CHANNELS AND METHOD OF MAKING THE SAME

(71) Applicant: SANDISK TECHNOLOGIES LLC, Plano, TX (US)

(72) Inventors: Yangyin Chen, Leuven (BE); Christopher Petti, Mountain View, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 90 days.

(21) Appl. No.: 15/951,916

(22) Filed: Apr. 12, 2018

(65) Prior Publication Data

US 2019/0319100 A1 Oct. 17, 2019

(51) Int. Cl.
*H01L 29/10* (2006.01)
*H01L 27/11556* (2017.01)
(Continued)

(52) U.S. Cl.
CPC .... *H01L 29/1037* (2013.01); *H01L 21/02236* (2013.01); *H01L 21/02532* (2013.01); *H01L 27/1157* (2013.01); *H01L 27/11524* (2013.01); *H01L 27/11556* (2013.01); *H01L 27/11582* (2013.01); *H01L 29/0657* (2013.01); *H01L 29/161* (2013.01); *H01L 29/36* (2013.01)

(58) Field of Classification Search
CPC ........... H01L 29/1037; H01L 21/02236; H01L 21/02532; H01L 27/11524; H01L 27/11556; H01L 27/1157; H01L 27/11582; H01L 29/0657; H01L 29/161; H01L 29/36

USPC ......................................................... 257/315
See application file for complete search history.

(56) References Cited

U.S. PATENT DOCUMENTS

| 5,915,167 A | 6/1999 | Leedy |
| 6,998,305 B2 | 2/2006 | Arena et al. |
(Continued)

FOREIGN PATENT DOCUMENTS

WO    WO2002/015277 A2    2/2002

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.

(Continued)

*Primary Examiner* — Hrayr A Sayadian
(74) *Attorney, Agent, or Firm* — The Marbury Law Group PLLC

(57) ABSTRACT

An alternating stack of insulating layers and sacrificial material layers is formed over a substrate. The sacrificial material layers are formed as, or are subsequently replaced with, electrically conductive layers. Memory openings are formed through the alternating stack. A memory film is formed within each memory openings. A silicon-germanium alloy layer including germanium at an atomic concentration less than 25% is deposited within each memory opening. An oxidation process is performed on the silicon-germanium alloy layer. A vertical semiconductor channel including an unoxidized remaining material portion of the silicon-germanium alloy layer is formed, which includes germanium at an atomic concentration greater than 50%.

10 Claims, 29 Drawing Sheets

(51) Int. Cl.

| | | |
|---|---|---|
| H01L 27/11582 | (2017.01) | |
| H01L 27/11524 | (2017.01) | |
| H01L 21/02 | (2006.01) | |
| H01L 29/06 | (2006.01) | |
| H01L 29/36 | (2006.01) | |
| H01L 29/161 | (2006.01) | |
| H01L 27/1157 | (2017.01) | |

(56) References Cited

U.S. PATENT DOCUMENTS

| | | |
|---|---|---|
| 7,005,350 B2 | 2/2006 | Walker et al. |
| 7,023,739 B2 | 4/2006 | Chen et al. |
| 7,177,191 B2 | 2/2007 | Fasoli et al. |
| 7,221,588 B2 | 5/2007 | Fasoli et al. |
| 7,233,522 B2 | 6/2007 | Chen et al. |
| 7,514,321 B2 | 4/2009 | Mokhlesi et al. |
| 7,575,973 B2 | 8/2009 | Mokhlesi et al. |
| 7,696,559 B2 | 4/2010 | Arai et al. |
| 7,745,265 B2 | 6/2010 | Mokhlesi et al. |
| 7,808,038 B2 | 10/2010 | Mokhlesi et al. |
| 7,848,145 B2 | 12/2010 | Mokhlesi et al. |
| 7,851,851 B2 | 12/2010 | Mokhlesi et al. |
| 8,008,710 B2 | 8/2011 | Fukuzumi |
| 8,053,829 B2 | 11/2011 | Kang et al. |
| 8,187,936 B2 | 5/2012 | Alsmeier et al. |
| 8,193,054 B2 | 6/2012 | Alsmeier |
| 8,198,672 B2 | 6/2012 | Alsmeier |
| 8,349,681 B2 | 1/2013 | Alsmeier et al. |
| 8,394,681 B2 | 1/2013 | Alsmeier et al. |
| 8,394,716 B2 | 3/2013 | Hwanq et al. |
| 8,614,126 B1 | 12/2013 | Lee et al. |
| 8,658,499 B2 | 2/2014 | Makala et al. |
| 8,946,023 B2 | 2/2015 | Makala et al. |
| 9,023,719 B2 | 5/2015 | Pachamuthu et al. |
| 9,230,980 B2 | 1/2016 | Rabkin et al. |
| 9,331,093 B2 | 5/2016 | Rabkin et al. |
| 9,397,093 B2 | 7/2016 | Makala et al. |
| 9,449,983 B2 | 9/2016 | Yada et al. |
| 9,478,495 B1 | 10/2016 | Pachamuthu et al. |
| 2007/0210338 A1 | 9/2007 | Orlowski |
| 2007/0252201 A1 | 11/2007 | Kito et al. |
| 2009/0101969 A1 | 4/2009 | Katsumata et al. |
| 2009/0230449 A1 | 9/2009 | Sakaguchi et al. |
| 2009/0242967 A1 | 10/2009 | Katsumata et al. |
| 2010/0044778 A1 | 2/2010 | Seol |
| 2010/0112769 A1 | 5/2010 | Son et al. |
| 2010/0120214 A1 | 5/2010 | Park et al. |
| 2010/0140685 A1 | 6/2010 | Kang et al. |
| 2010/0155810 A1 | 6/2010 | Kim et al. |
| 2010/0155818 A1 | 6/2010 | Cho |
| 2010/0181610 A1 | 7/2010 | Kim et al. |
| 2010/0207195 A1 | 8/2010 | Fukuzumi et al. |
| 2010/0258852 A1 | 10/2010 | Lim et al. |
| 2010/0320528 A1 | 12/2010 | Jeong et al. |
| 2011/0076819 A1 | 3/2011 | Kim et al. |
| 2011/0133606 A1 | 6/2011 | Yoshida et al. |
| 2011/0266606 A1 | 11/2011 | Park et al. |
| 2012/0001247 A1 | 1/2012 | Alsmeier |
| 2012/0001249 A1 | 1/2012 | Alsmeier |
| 2012/0001250 A1 | 1/2012 | Alsmeier |
| 2012/0012920 A1 | 1/2012 | Shin et al. |
| 2012/0256247 A1 | 10/2012 | Alsmeier |
| 2013/0248974 A1 | 9/2013 | Alsmeier et al. |
| 2013/0264631 A1 | 10/2013 | Alsmeier et al. |
| 2013/0313627 A1 | 11/2013 | Lee et al. |
| 2015/0076580 A1 | 3/2015 | Pachamuthu et al. |
| 2015/0076584 A1 | 3/2015 | Pachamuthu et al. |
| 2017/0365613 A1 | 12/2017 | Gunji-Yoneoka et al. |

OTHER PUBLICATIONS

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Endoh et al., "Novel Ultra High Density Memory with a Stacked-Surrounding Gate Transistor (S-SGT) Structured Cell," IEDM Proc. (2001) 33-36.

Tanaka et al., "Bit-Cost Scalable Technology for Low-Cost and Ultrahigh-Density Flash Memory," Toshiba Review, vol. 63, No. 2, 2008, pp. 28-31.

Kimura, M. "3D Cells Make Terabit NAND Flash Possible," Nikkei Electronics Asia, Sep. 17, 2009, 6pgs.

Jang et al., "Memory Properties of Nickel Silicide Nanocrystal Layer for Possible Application to Nonvolatile Memory Devices," IEEE Transactions on Electron Devices, vol. 56, No. 12, Dec. 2009.

Chen et al., "Reliability Characteristics of NiSi Nanocrystals Embedded in Oxide and Nitride Layers for Nonvolatile Memory Application," Applied Physics Letters 92, 152114 (2008).

J. Ooshita, Toshiba Announces 32Gb 3D-Stacked Multi-Level NAND Flash, 3 pages, http://techon.nikkeibp.co.jp/english/NEWS_EN/20090619/171977/ Nikkei Microdevices, Tech-On, Jun. 19, 2009.

Li et al., "Sacrificial Polymers for Nanofluidic Channels in Biological Applications", Nanotechnology 14 (2003) 578-583.

Invitation to pay additional fees and partial international search report received in connection with international application No. PCT/US2014/054246; dated Dec. 3, 2014.

International Search Report and Written Opinion received in connection with international application No. PCT/US2014/054246; dated Feb. 13, 2015.

Jung et al., "Implementation of Both High-Hole and Electron Mobility in Strained Si/Strained $Si_{1-y}Ge_y$ Relaxed $Si_{1-x}Ge_x$ (x<y) Virtual Substrate," IEEE Electron Device Letters, vol. 24, No. 7, Jul. 2003.

Watakabe et al., "Electrical and Structural Properties of Poly-SiGe Film Formed by Pulsed-Laser Annealing," Journal of Applied Physics, vol. 95, No. 11, Jun. 2004.

Datta et al., "Advanced Si and SiGe Strained Channel NMOS and PMOS Transistors with High-K/Metal-Gate Stack," IEEE BCTM 10.2, 2004.

Jin et al., "High-Performance Polycrystalline SiGe Thin-Film Transistors Using $Al_2O_3$ Gate Insulators," IEEE Electron Device Letters, vol. 19, No. 12, Dec. 1998.

Irisawa, T. et al., "Ultrahigh Room-Temperature Hole Hall and Effective Mobility in Si0.3Ge0.7/Ge/Si0.3Ge0.7 Heterostructures," Applied Physics Letters, vol. 81, No. 5, pp. 847-849, (2002).

Liu, Y. et al., "High-quality single-crystal Ge on insulator by liquid-phase epitaxy on Si substrates," Applied Physics Letters 84, No. 14, pp. 2563-2565 (2004).

Zhang, R. et al., Impact of Channel Orientation on Electrical Properties of Ge p- and n-MOSFETs With 1-nm EOT Al2O3/GeOx/Ge Gate-Stacks Fabricated by Plasma Postoxidation, IEEE Transactions on Electron Devices, vol. 61, No. 11, pp. 3668-3675, (2014).

Zhang, R. et al., "Al 2 O 3 / GeO x / Ge gate stacks with low interface trap density fabricated by electron cyclotron resonance plasma postoxidation," Applied Physics Letters, vol. 98, pp. 112902-1-112902-3, (2011).

Kim, W. K. et al., "Properties of Ultrathin-Body Condensation Ge-On-Insulator Films Thinned by Additional Thermal Oxidation," Japanese Journal of Applied Physics, vol. 54, 7 pages, (2015).

Olesinski, R. W. et al., "The Ge—Si (Germanium-Silicon) System," Bulletin of Alloy Phase Diagrams, vol. 5, No. 2, 4 pages, (1984).

Kuhn, K. J. et al., "Past, Present and Future: SiGe and CMOS Transistor Scaling," ECS Transactions, vol. 33, No. 6, 15 pages, (2010).

Gleskova, H. et al., "Field-Effect Mobility of Amorphous Silicon Thin-Film Transistors Understand Strain," Journal of Non-Crystalline Solids, 4 pages, (2004).

"Formation process of high-purity Ge-on-insulator layers by Ge-condensation technique", S. Nakaharai, T. Tezuka, N. Hirashita, E. Toyoda, Y. Moriyama, N. Sugiyama, and S. Takagi, Journal of Applied Physics 105, 024515, 2009.

(56) References Cited

OTHER PUBLICATIONS

"First Demonstration of High-Ge-Content Strained-Si1−xGex (x=0.5) on Insulator PMOS FinFETs with High Hole Mobility and Aggressively Scaled Fin Dimensions and Gate Lengths for High-Performance Applications", Pouya Hashemi, Karthik Balakrishnan, Sebastian U. Engelmann, John A. Ott, Ali Khakifirooz, Ashish Baraskar, Marinus Hopstaken, Joseph S. Newbury, Kevin K. Chan, Effendi Leobandung, Renee T. Mo and Dae-Gyu Park, IEDM 2014, T16-01.

"High-Mobility High-Ge-Content Si1−xGex-OI PMOS FinFETs with Fins Formed Using 3D Germanium Condensation with Ge Fraction up to x~ 0.7, Scaled EOT~8.5Å and ~10nm Fin Width", P. Hashemi, T. Ando, K. Balakrishnan, J. Bruley, S. Engelmann, J. A. Ott, V. Narayanan, D.-G. Park, R.T. Mo, E. Leobandung, VLSI Tech. Symp., T2-3, 2015.

"High Performance and Record Subthreshold Swing Demonstration in Scaled RMG SiGe FinFETs with High-Ge-Content Channels Formed by 3D Condensation and a Novel Gate Stack Process", P. Hashemi, T. Ando, S. Koswatta, K.-L. Lee, E. Cartier, J. A. Ott, C.-H. Lee, J. Bruley,M. F. Lofaro, S. Dawes, K. K. Chan, S. U. Engelmann, E. Leobandung, V. Narayanan and R. T. Mo, VLSI Tech. Symp., T9-1, 2017.

"High Performance 4.5-nm-Thick Compressively-Strained Ge-on-Insulator pMOSFETs Fabricated by Ge Condensation with Optimized Temperature Control", W.-K. Kim, M. Takenaka, and S. Takagi, VLSI Tech. Symp., 2017, T9-3.

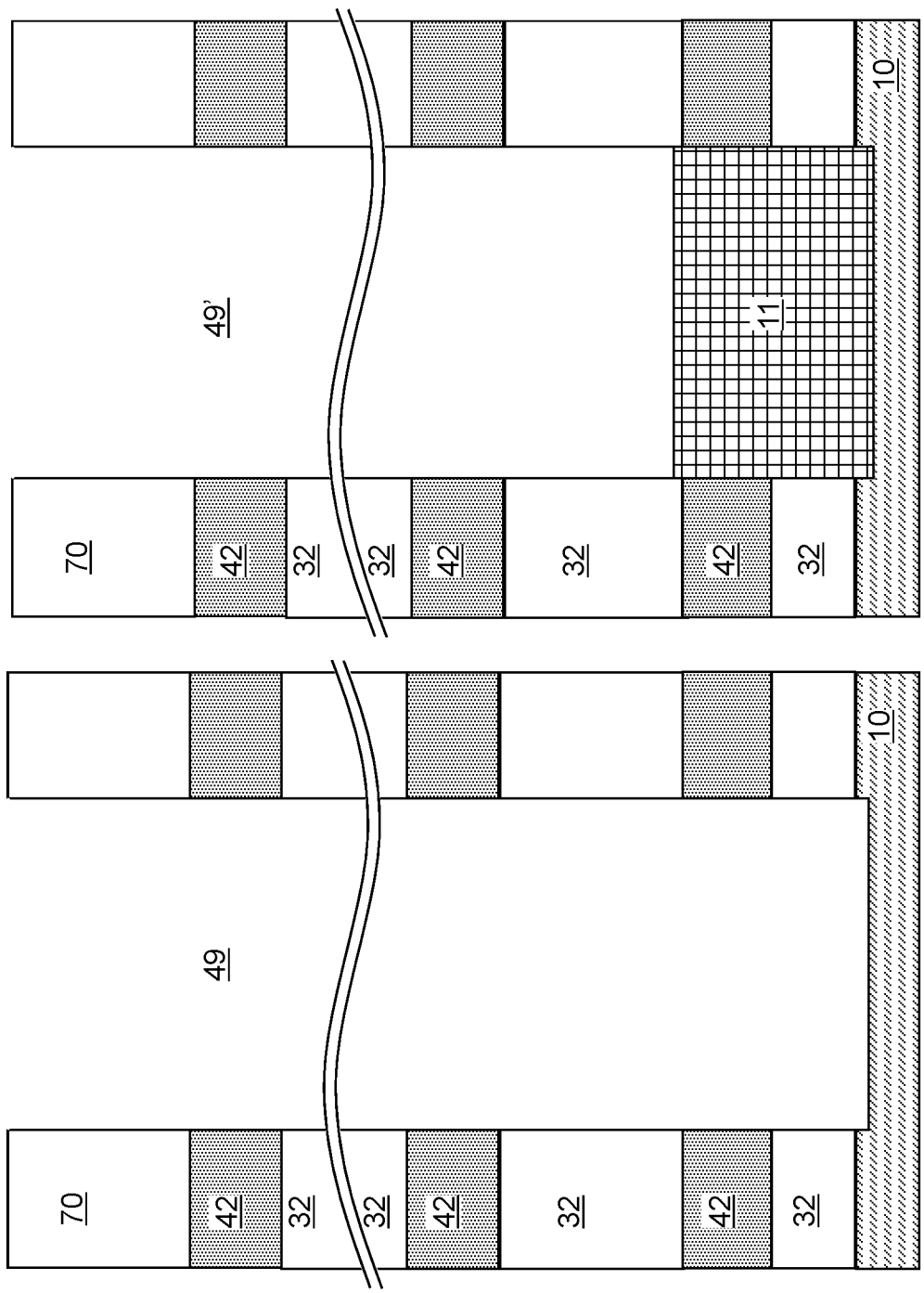

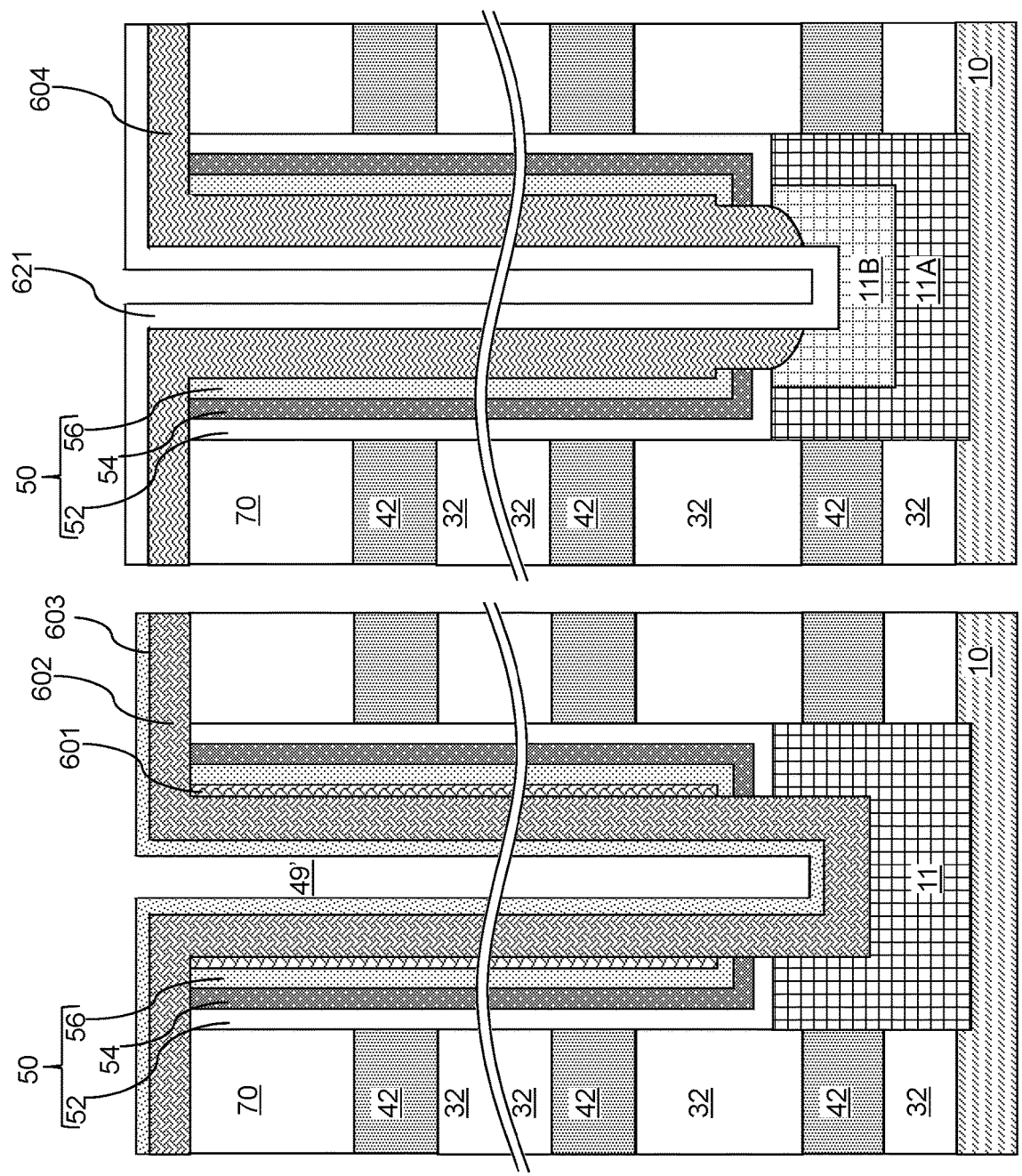

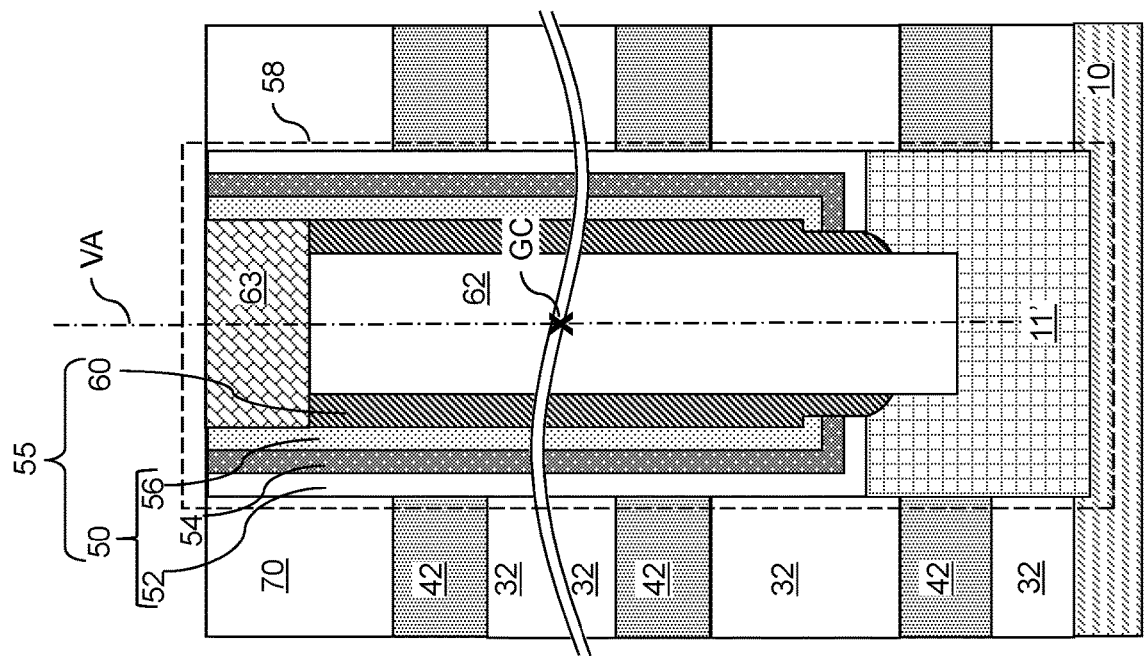
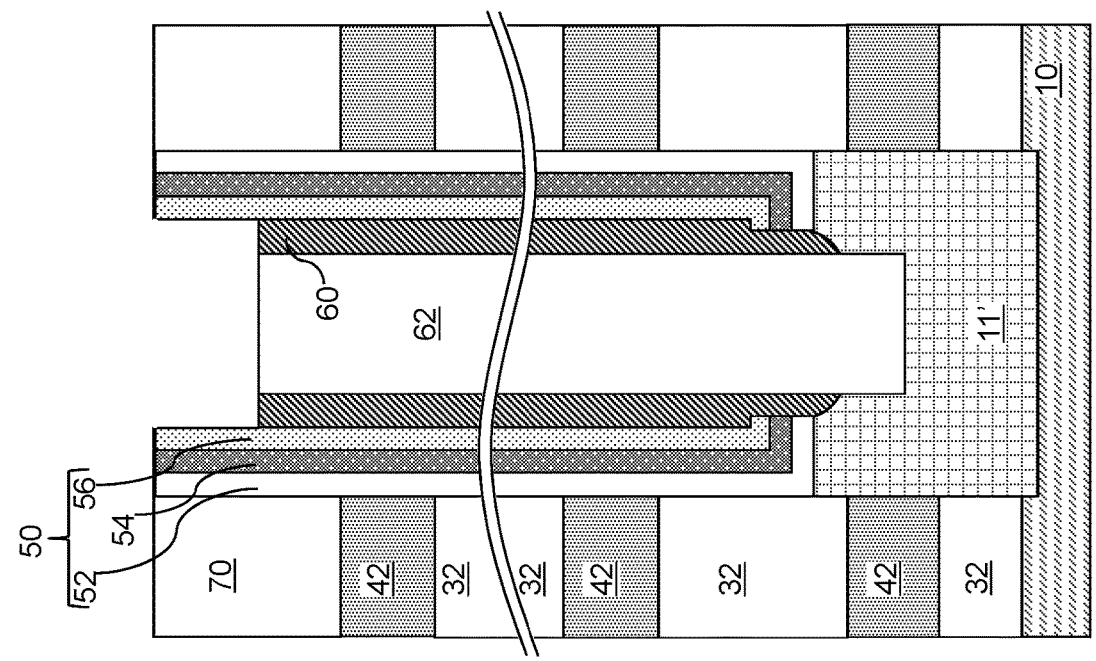

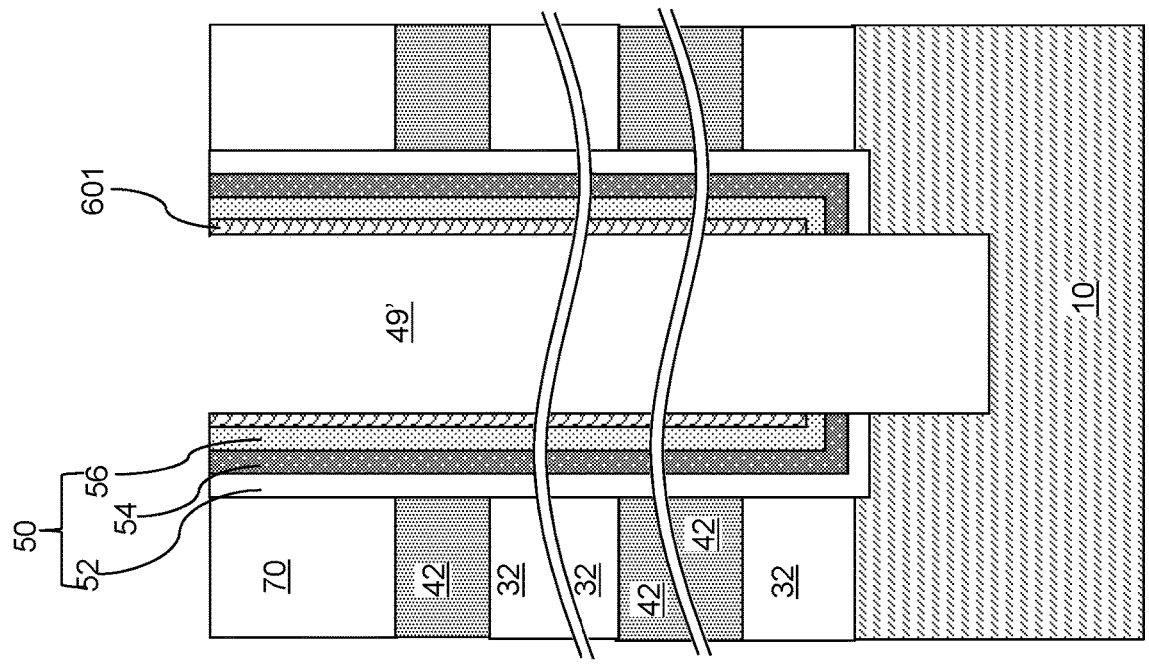
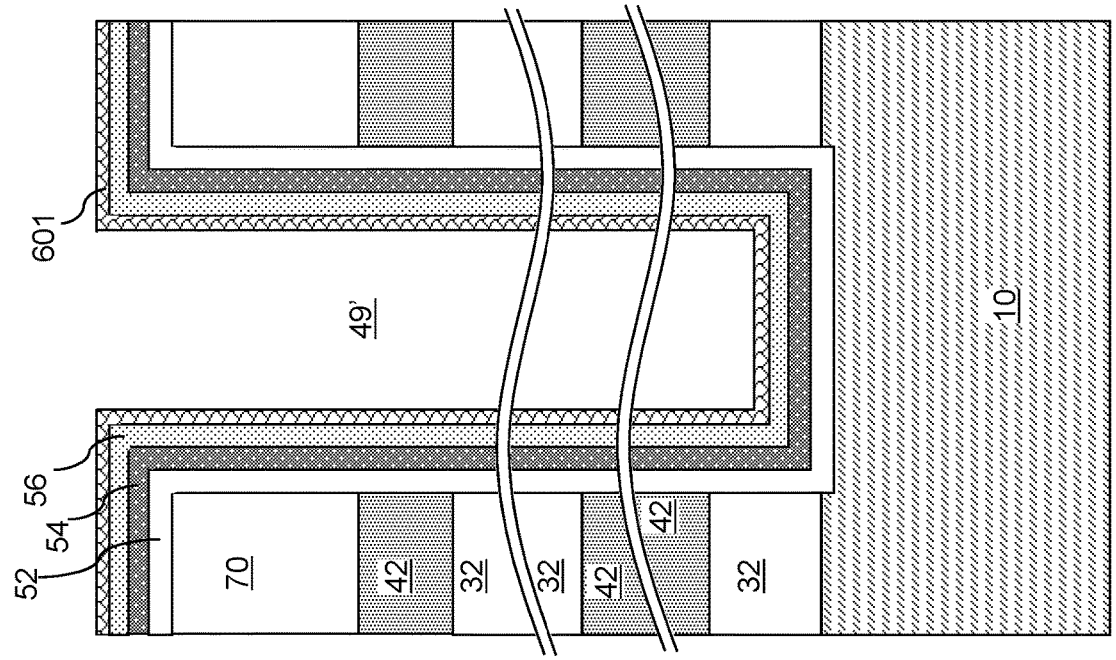

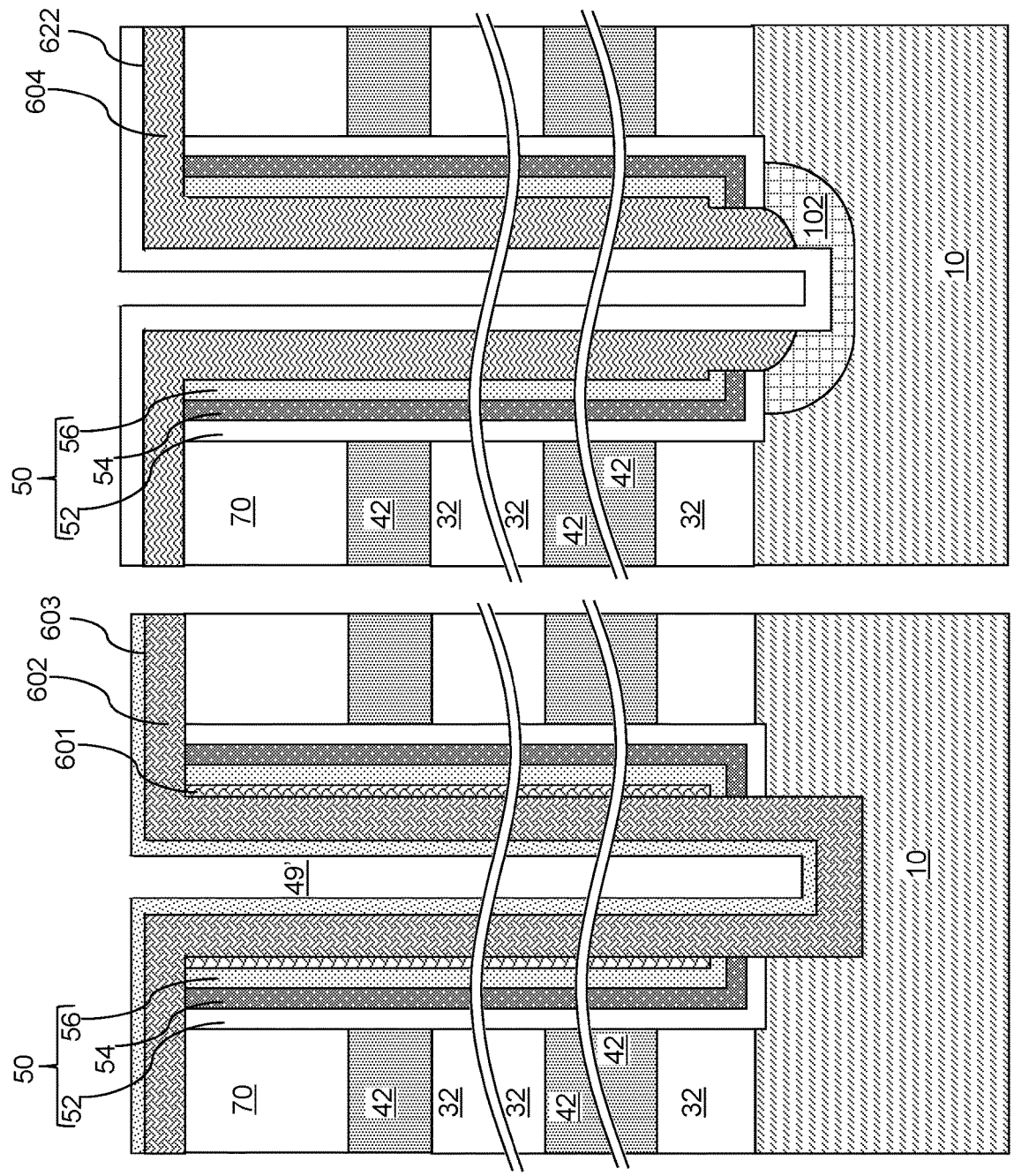

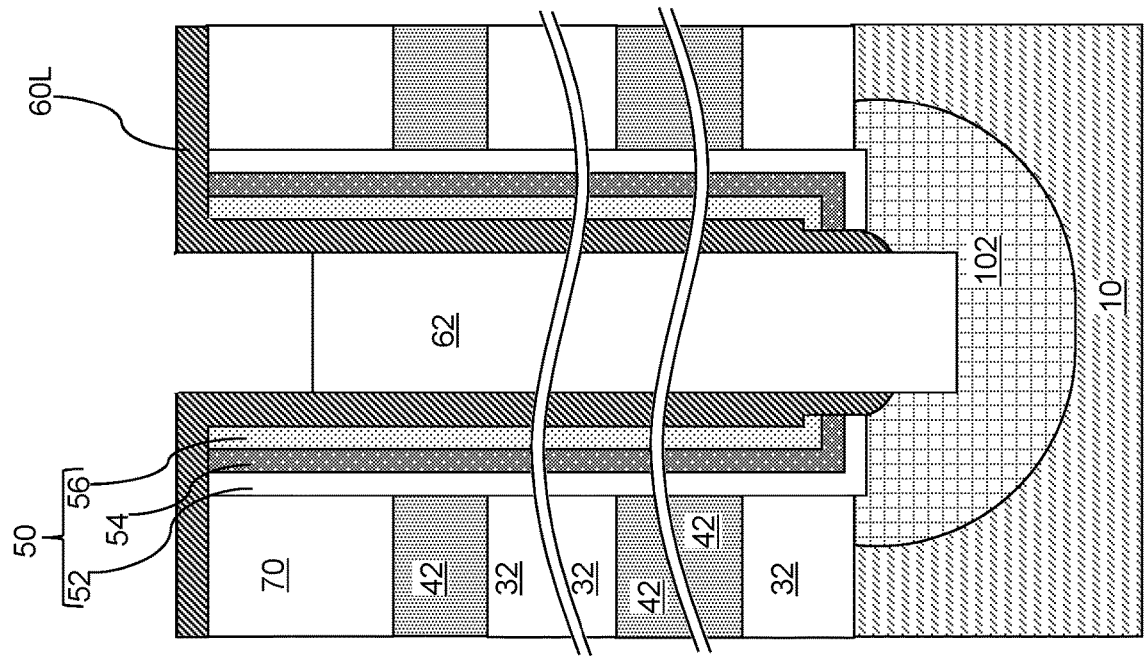
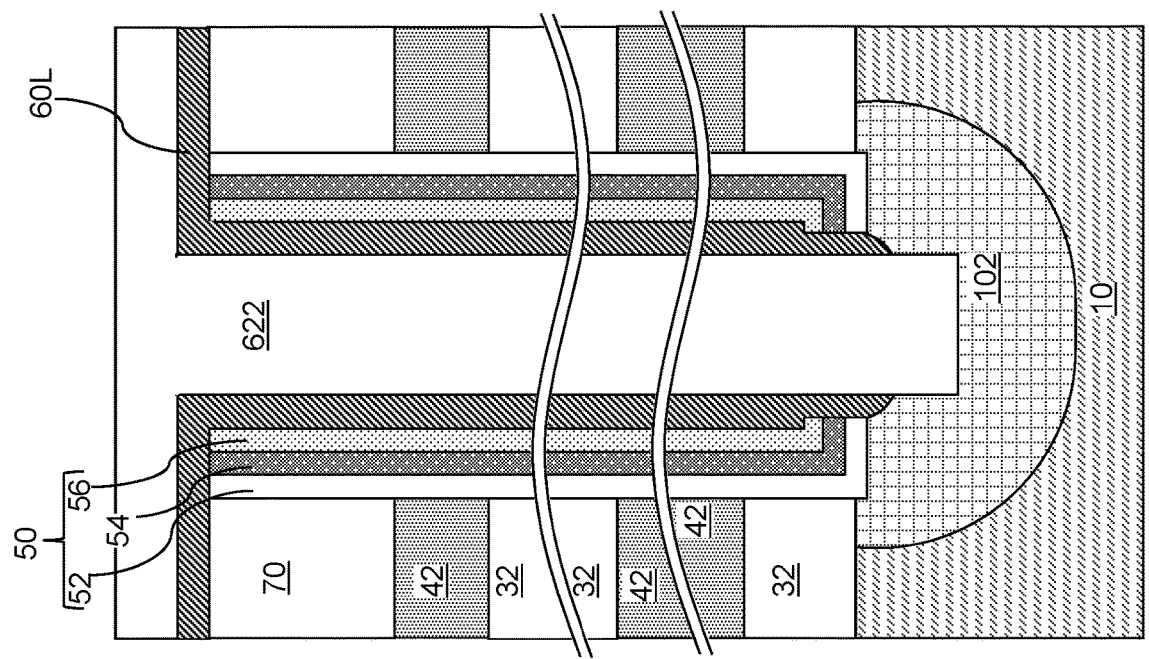

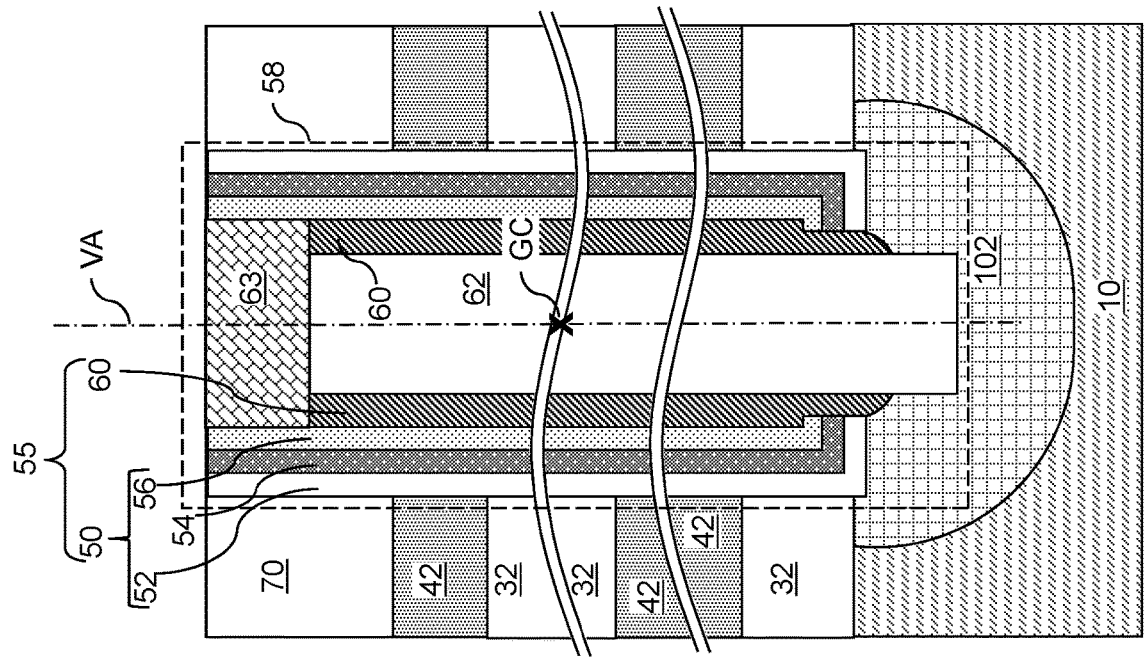
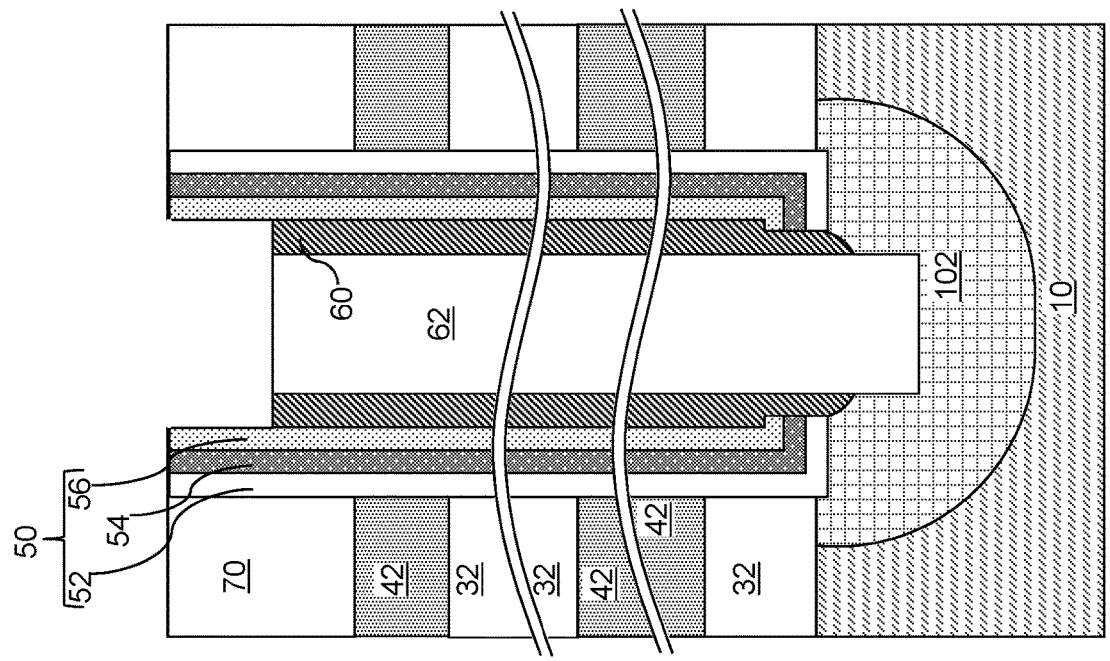
FIG. 6H
FIG. 6G

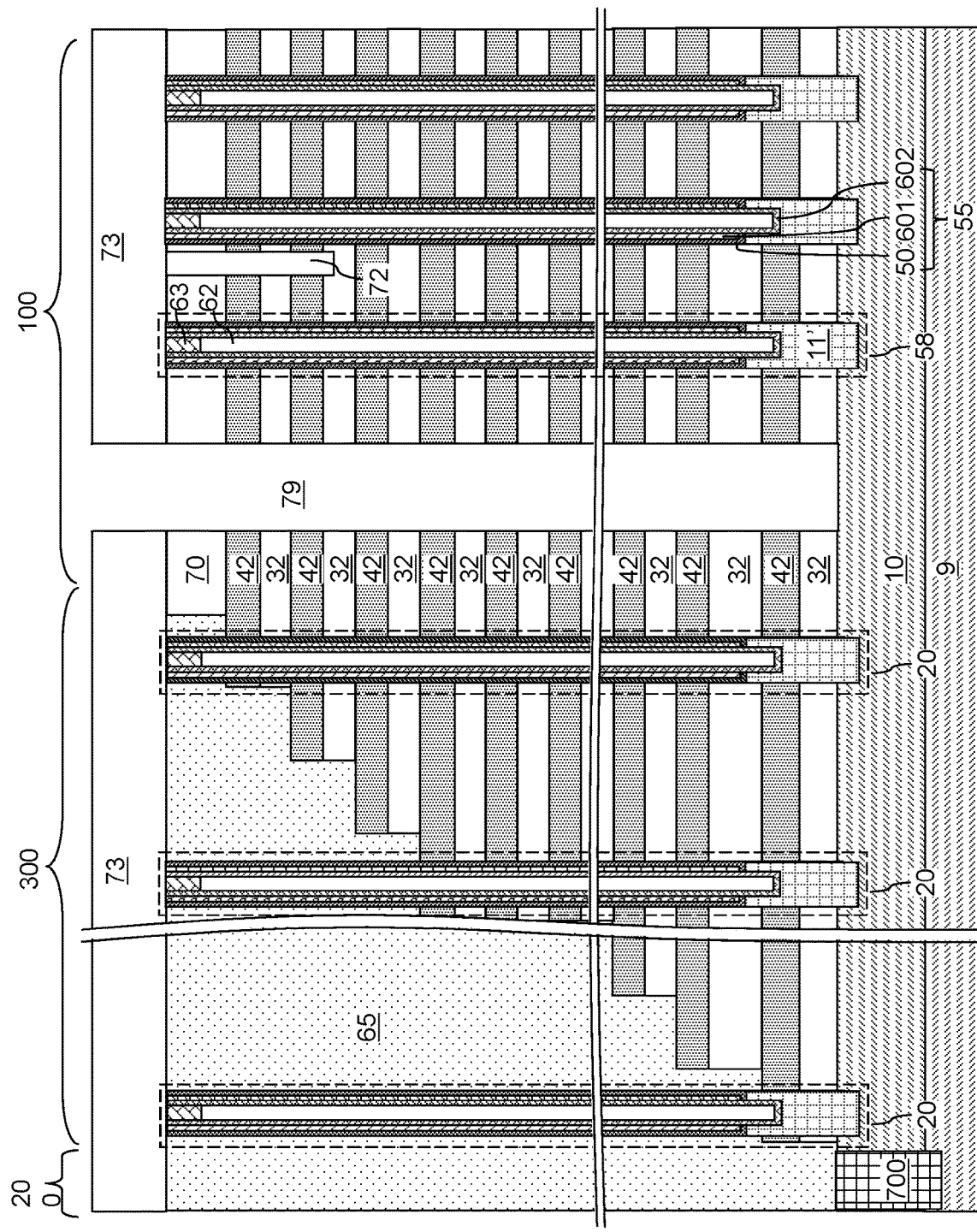

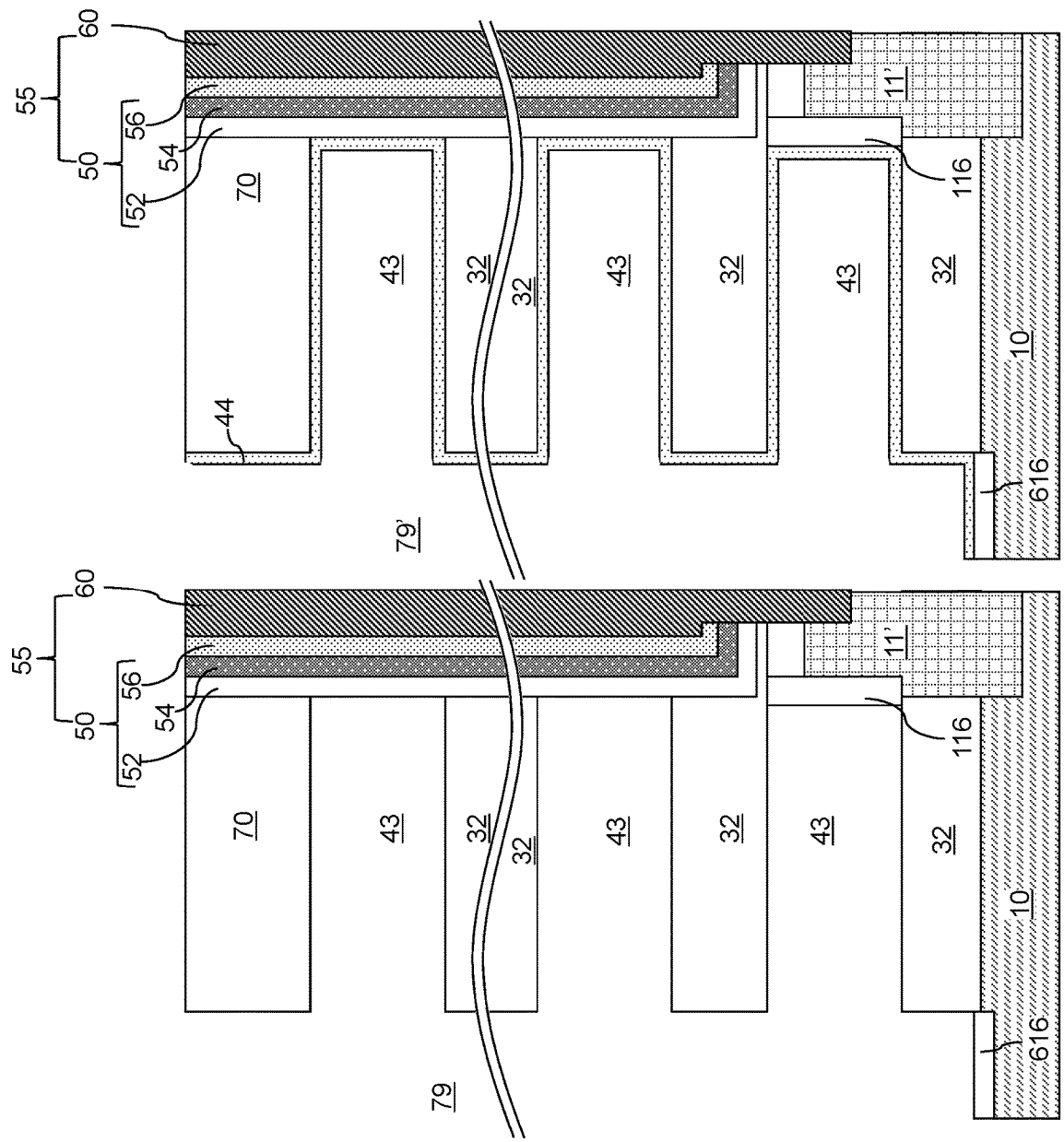

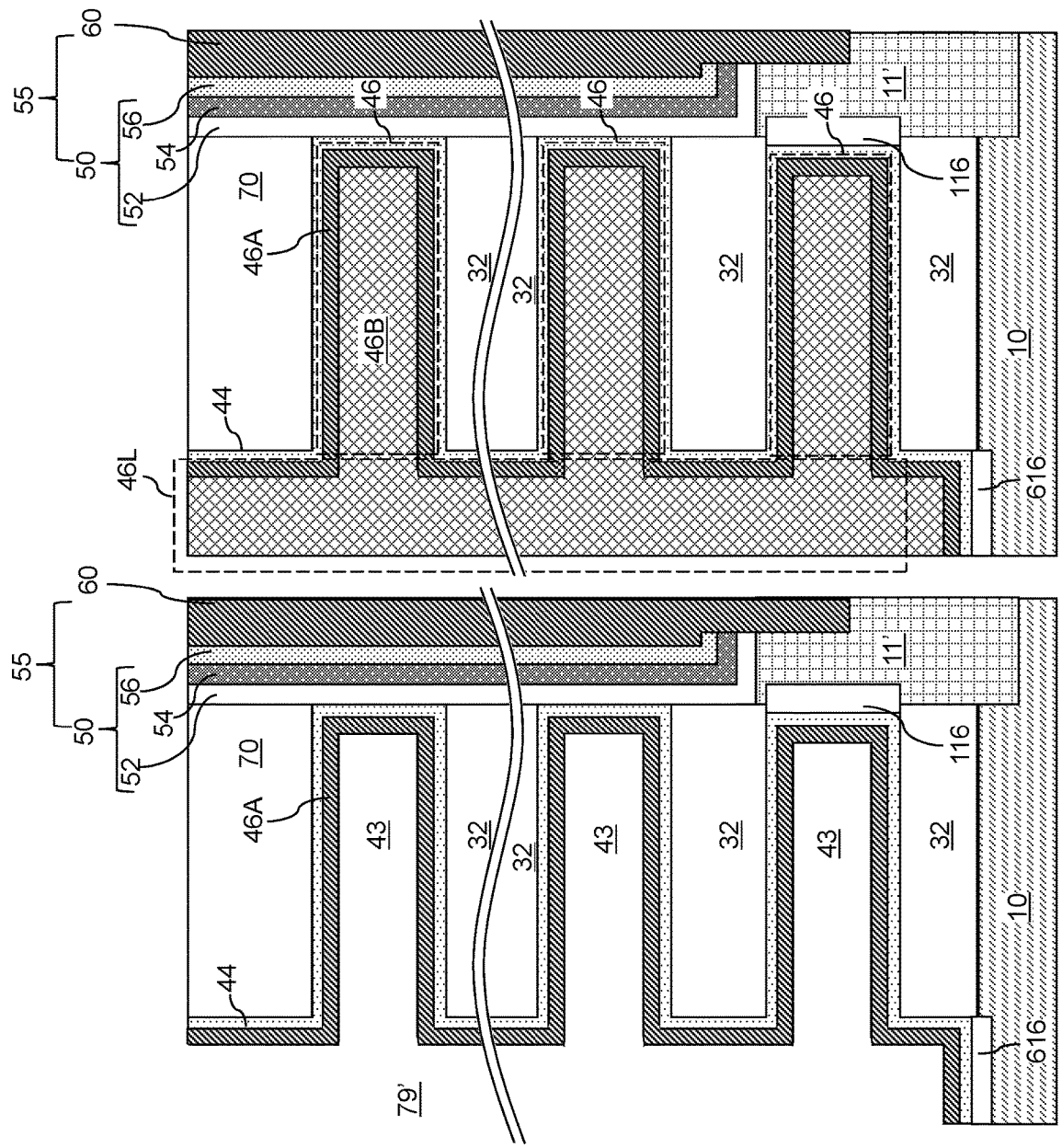

US 10,756,186 B2
// 1

THREE-DIMENSIONAL MEMORY DEVICE INCLUDING GERMANIUM-CONTAINING VERTICAL CHANNELS AND METHOD OF MAKING THE SAME

FIELD

The present disclosure relates generally to the field of semiconductor devices, and particular to a three-dimensional memory device employing germanium-containing vertical channels and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a method of forming a three-dimensional memory device comprises forming an alternating stack of insulating layers and sacrificial material layers over a substrate, wherein the sacrificial material layers are formed as, or are subsequently replaced with, electrically conductive layers, forming a memory opening through the alternating stack and forming a memory film in the memory opening. The method further comprises depositing a silicon-germanium alloy layer including germanium at an atomic concentration less than 25% within the memory opening over the tunneling dielectric layer, and performing an oxidation process on the silicon-germanium alloy layer to form a vertical semiconductor channel in an unoxidized remaining material portion of the silicon-germanium alloy layer. The vertical semiconductor channel comprises germanium at an atomic concentration greater than 50%.

According to another aspect of the present disclosure, a three-dimensional memory device is provided, which comprises: an alternating stack of insulating layers and electrically conductive layers located over a substrate; and a memory stack structure extending through the alternating stack, wherein the memory stack structure comprises a memory film and a vertical semiconductor channel contacting an inner sidewall of the memory film and comprising germanium at an atomic concentration greater than 50%, and a semiconductor oxide core laterally surrounded by the vertical semiconductor channel, wherein the semiconductor oxide core comprises a silicon-germanium oxide material having a radial concentration gradient of atomic concentration of silicon.

According to another aspect of the present disclosure, a three-dimensional memory device is provided, which comprises: an alternating stack of insulating layers and electrically conductive layers located over a substrate; and a memory stack structure extending through the alternating stack, wherein the memory stack structure comprises a memory film and a vertical semiconductor channel contacting an inner sidewall of the memory film and comprising germanium at an atomic concentration greater than 50%, and a silicon-germanium alloy region located below the memory film, wherein the silicon-germanium alloy region has a vertical germanium concentration gradient such that a germanium concentration increases with a vertical distance from an interface with the memory film.

BRIEF DESCRIPTION OF THE DRAWINGS

FIGS. 5A-5J are sequential schematic vertical cross-sectional views of a memory opening within the exemplary structure during formation of a memory stack structure, an optional semiconductor oxide core, and a drain region therein according to an embodiment of the present disclosure.

FIGS. 6A-6H are sequential schematic vertical cross-sectional views of an alternative configuration of a memory opening within the exemplary structure during formation of a memory stack structure, an optional semiconductor oxide core, and a drain region therein according to an embodiment of the present disclosure.

FIG. 8A is a schematic vertical cross-sectional view of the exemplary structure after formation of backside trenches according to an embodiment of the present disclosure.

FIGS. 10A-10D are sequential vertical cross-sectional views of a region of the exemplary structure during formation of electrically conductive layers according to an embodiment of the present disclosure.

DETAILED DESCRIPTION

Figure 1:
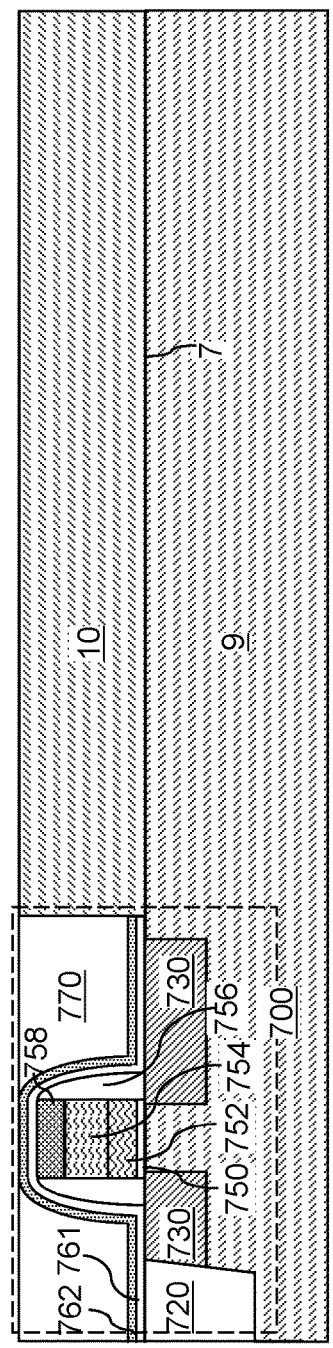
FIG. 1 is a schematic vertical cross-sectional view of an exemplary structure after formation of at least one peripheral device, a semiconductor material layer, and a gate dielectric layer according to an embodiment of the present disclosure.

As discussed above, the present disclosure is directed to a three-dimensional memory device employing germanium-containing vertical channels and methods of manufacturing the same, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. Unless otherwise indicated, a "contact" between elements refers to a direct contact between elements that provides an edge or a surface shared by the elements. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure can include a monolithic three-dimensional NAND string memory device, and can be fabricated employing the various embodiments described herein.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, an exemplary structure according to an embodiment of the present disclosure is illustrated, which can be employed, for example, to fabricate a device structure containing vertical NAND memory devices. The exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200.

Figure 2:
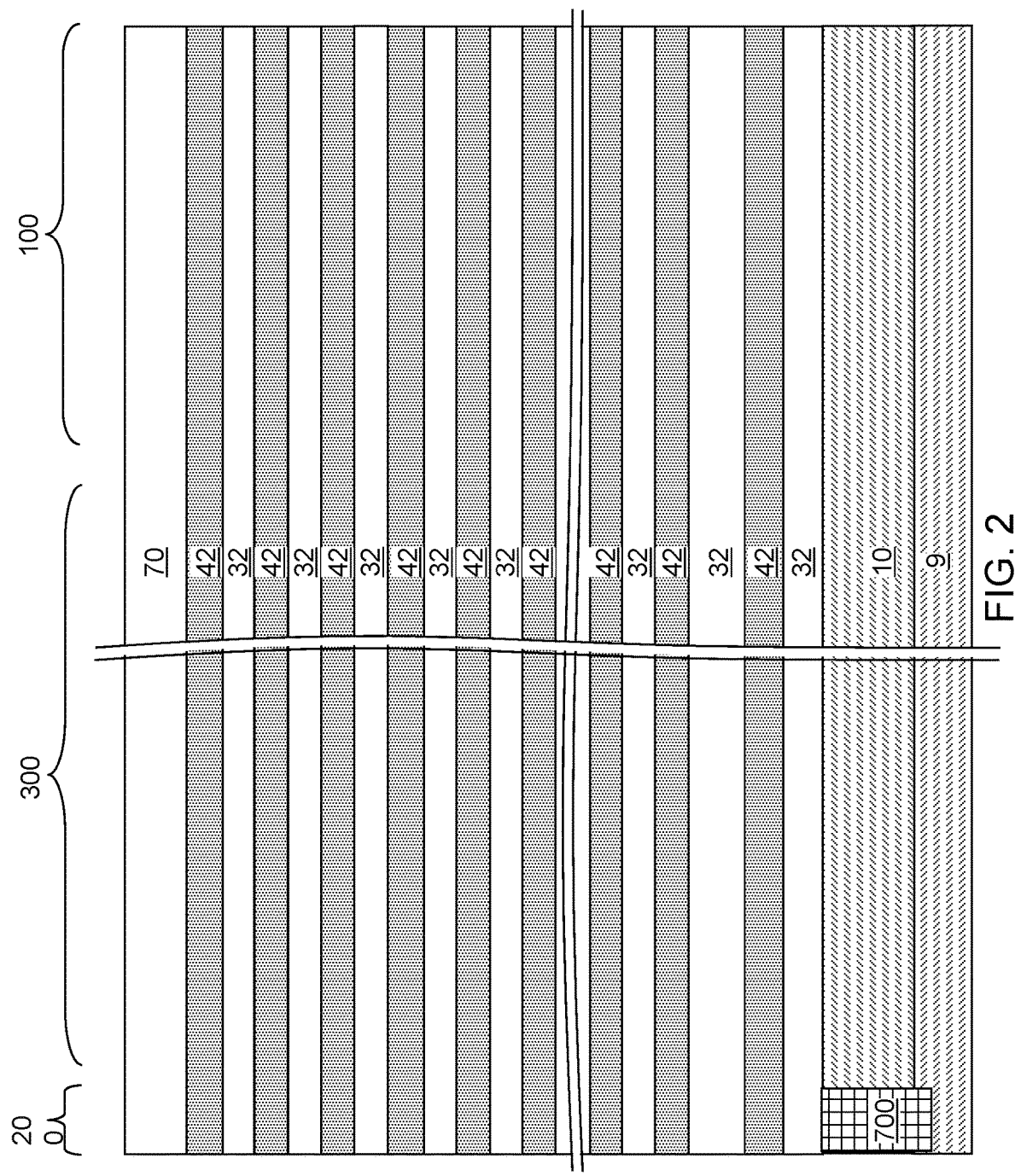
FIG. 2 is a schematic vertical cross-sectional view of the exemplary structure after formation of an alternating stack of insulating layers and sacrificial material layers according to an embodiment of the present disclosure.

Referring to FIG. 2, a stack of an alternating plurality of first material layers (which can be insulating layers 32) and second material layers (which can be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack includes an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3A:
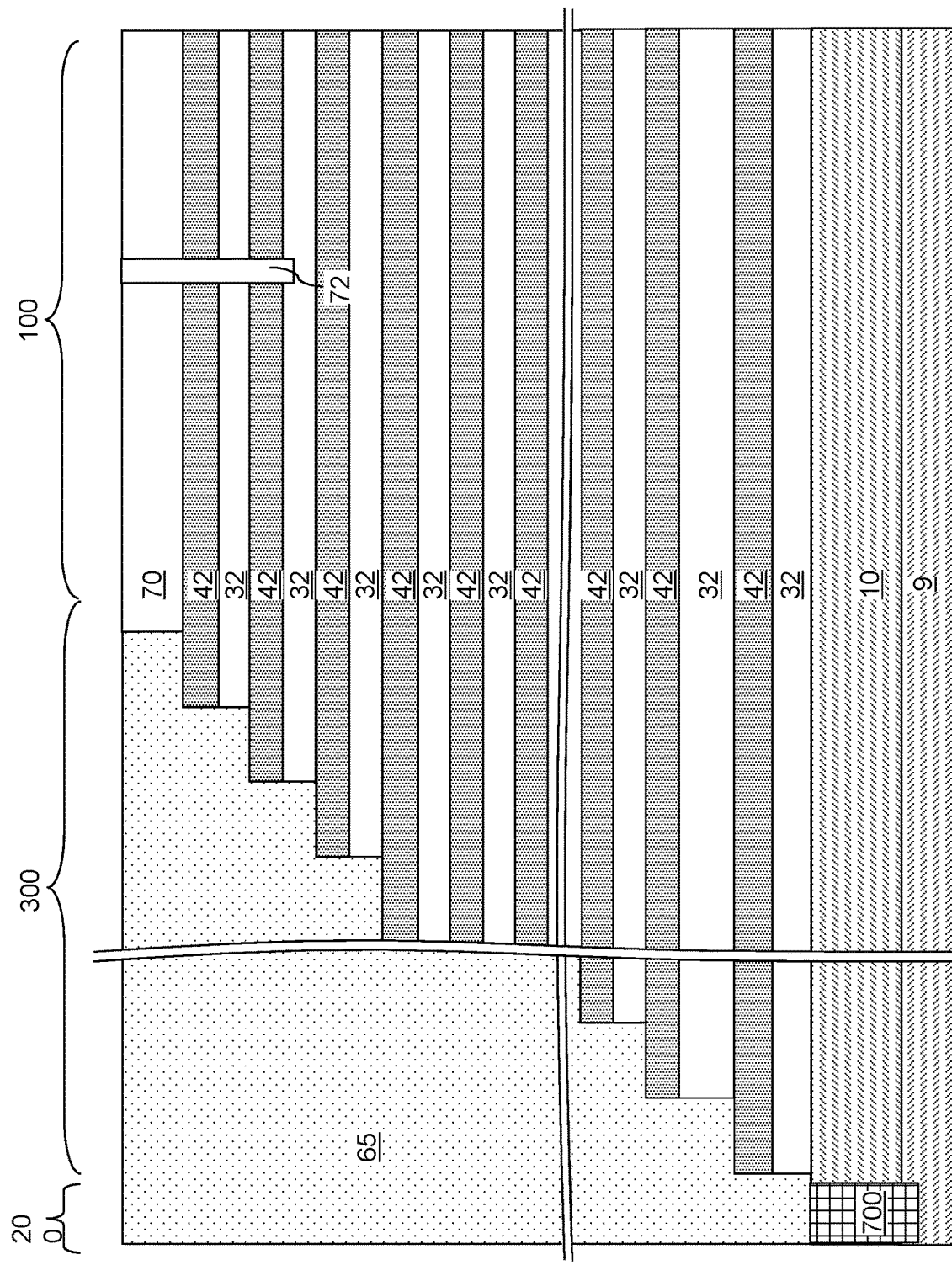
FIG. 3A is a schematic vertical cross-sectional view of the exemplary structure after formation of stepped terraces and a retro-stepped dielectric material portion according to an embodiment of the present disclosure.
Figure 3B:
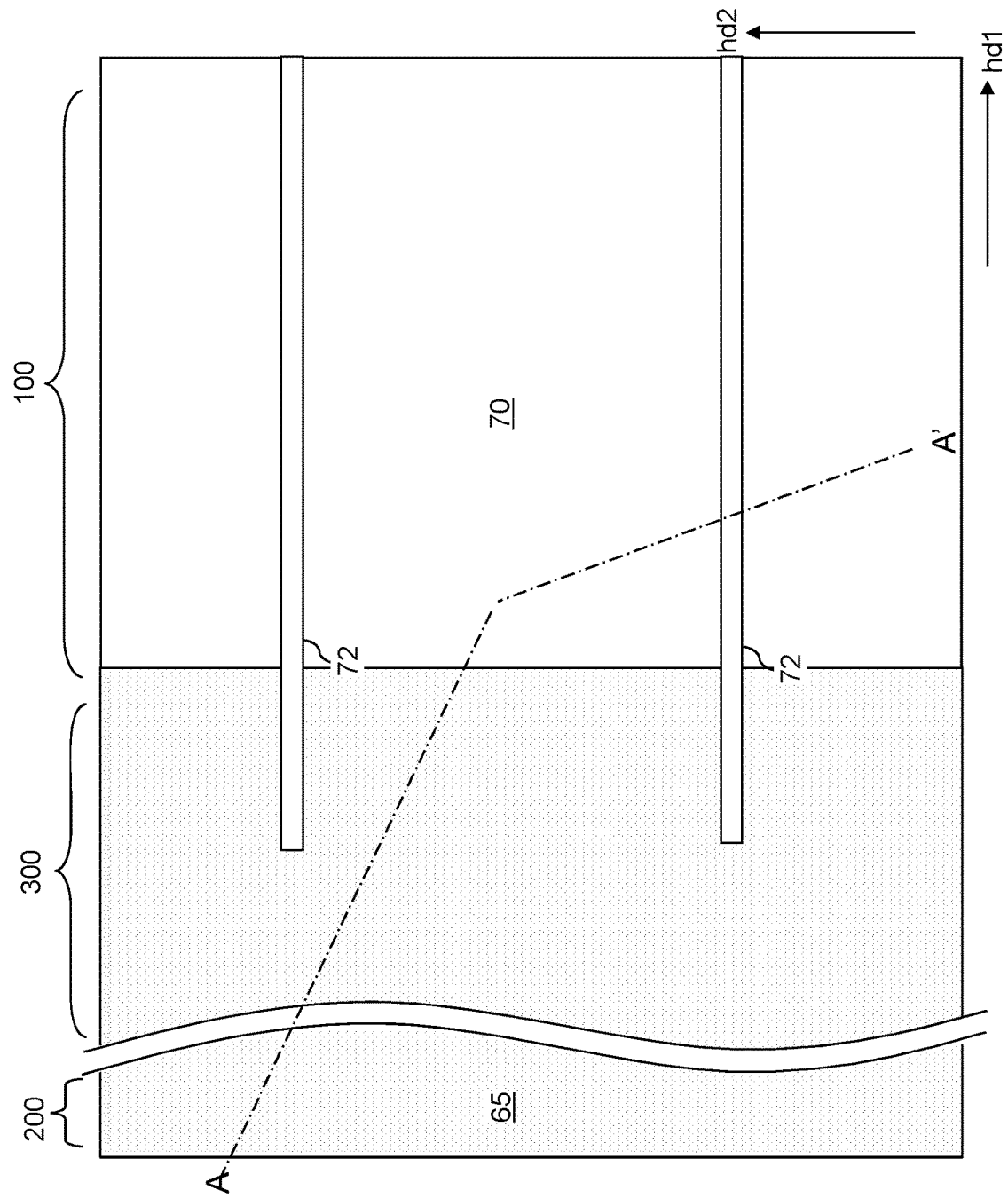
FIG. 3B is a top-down view of the exemplary structure of FIG. 3A. The vertical plane A-A' is the plane of the cross-section for FIG. 3A.

Referring to FIGS. 3A and 3B, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the contact region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset among one another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the contact region 300.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain select level isolation structures 72 can be formed through the insulating cap layer 70 and a subset of the sacrificial material layers 42 located at drain select levels. The drain select level isolation structures 72 can be formed, for example, by forming drain select level isolation trenches and filling the drain select level isolation trenches with a dielectric material such as silicon oxide. Excess portions of the dielectric material can be removed from above the top surface of the insulating cap layer 70.

Figure 4A:
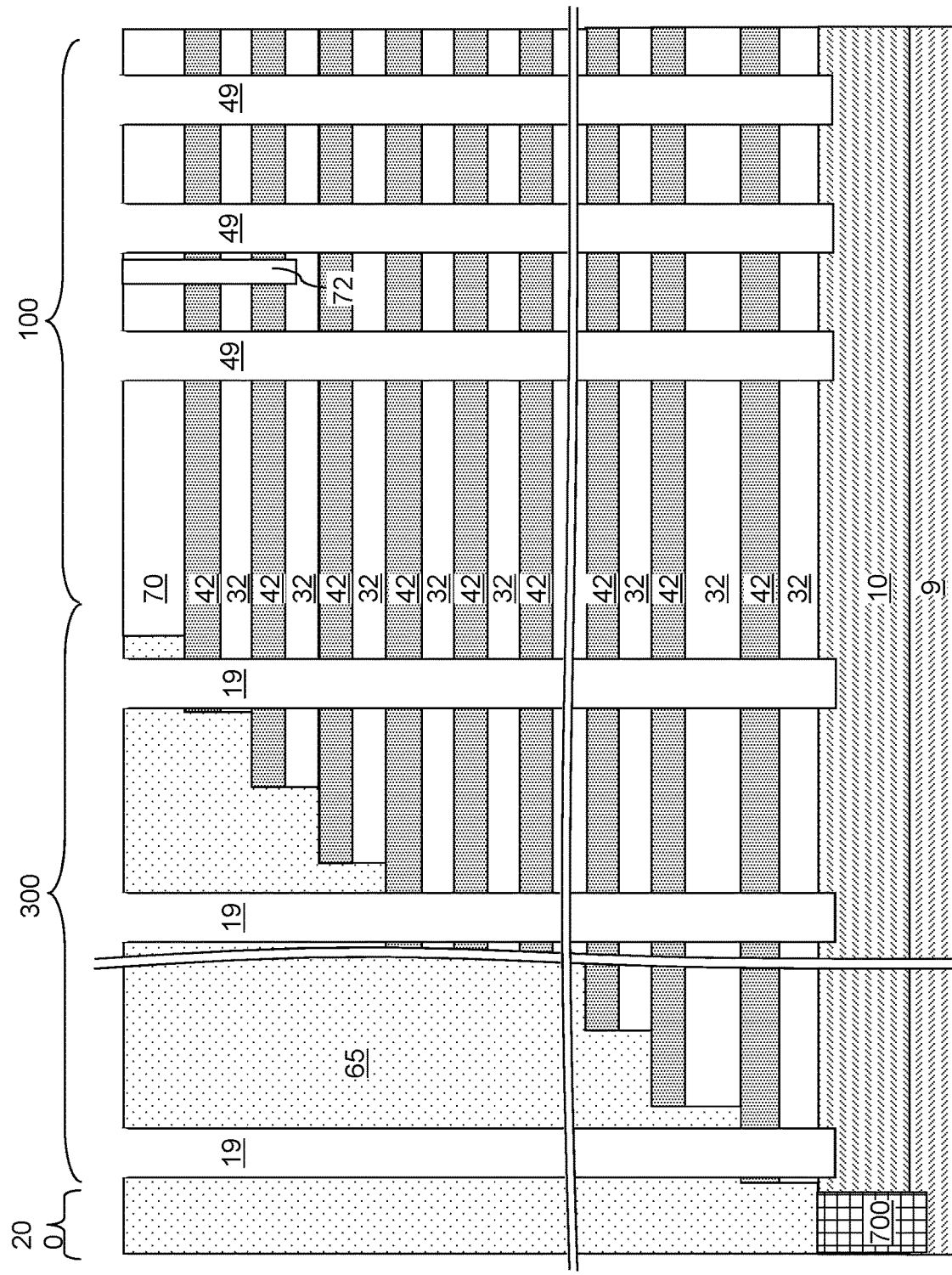
FIG. 4A is a schematic vertical cross-sectional view of the exemplary structure after formation of memory openings and support openings according to an embodiment of the present disclosure.
Figure 4B:
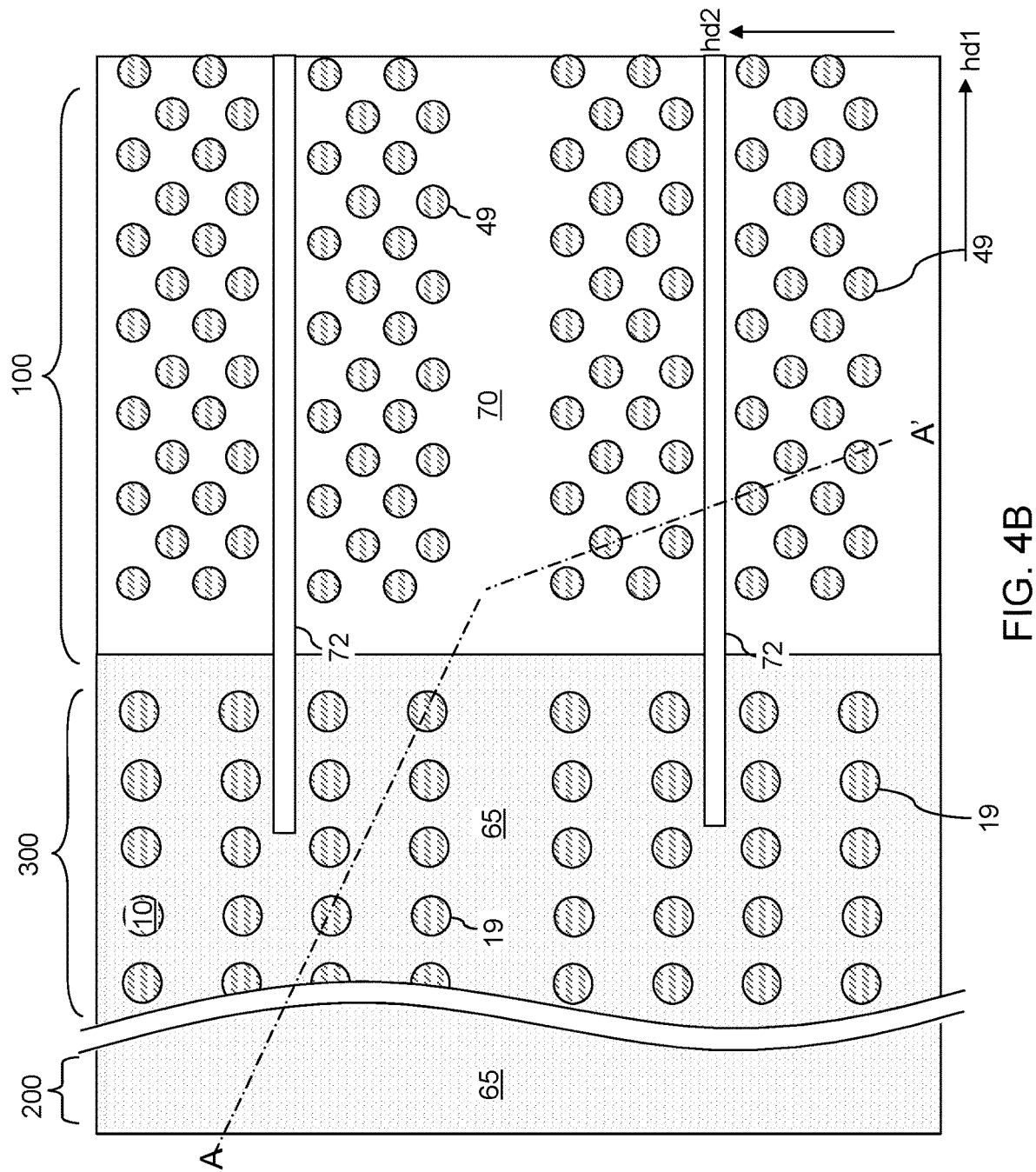
FIG. 4B is a top-down view of the exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 5A-5J illustrate structural changes in a memory opening 49 during formation of a memory opening fill structure of a first configuration. The memory opening 49 illustrated in FIGS. 5A-5J can be one of the memory openings 49 in the exemplary structure of FIGS. 4A and 4B. The same structural change occurs simultaneously in each of the other memory openings 49 and in each support opening 19.

Referring to FIG. 5A, a memory opening 49 in the exemplary device structure of FIGS. 4A and 4B is illustrated. The memory opening 49 extends through the insulating cap layer 70, the alternating stack (32, 42), and optionally into an upper portion of the semiconductor material layer 10. Generally, the semiconductor material layer 10 may be provided over a substrate semiconductor layer 9 with at least one intervening dielectric material layer and optional intervening metal interconnect structures connected to semiconductor devices (not shown) on the substrate semiconductor layer 9. Alternatively, the semiconductor material layer 10 can be a topmost layer of the substrate (9, 10) that includes a stack of a substrate semiconductor layer 9 and the semiconductor material layer 10 (which can be a doped well in the substrate semiconductor layer 9). At this processing step, each support opening 19 can extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed.

Referring to FIG. 5B, an optional pedestal channel portion 11 can be formed at the bottom portion of each memory opening 49 and each support openings 19, for example, by a selective semiconductor deposition process. In case the semiconductor material layer 10 includes a single crystalline semiconductor material such as single crystalline silicon, each pedestal channel portion 11 can include a single crystalline semiconductor material deposited by a selective epitaxy process and in epitaxial alignment with the single crystalline semiconductor material of the semiconductor material layer 10. In case the semiconductor material layer 10 includes a polycrystalline semiconductor material or an amorphous semiconductor material, each pedestal channel portion 11 can include an amorphous or polycrystalline semiconductor material. In one embodiment, the pedestal channel portion 11 can include single crystalline silicon, polysilicon, or amorphous silicon. In one embodiment, the pedestal channel portion 11 can include doped silicon consisting essentially of silicon and at least one electrical dopant (such as a p-type dopant or an n-type dopants) not exceeding 2% in atomic concentration.

In one embodiment, the pedestal channel portion 11 can be doped with electrical dopants of the same conductivity type as the semiconductor material layer 10. Alternatively, the semiconductor material layer 10 may include a source layer and the pedestal channel portion 11 can have a doping of an opposite conductivity type of the conductivity type of the semiconductor material layer 10. In one embodiment, the top surface of each pedestal channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the pedestal channel portions 11 with a respective conductive material layer. The pedestal channel portion 11 can be a portion of a transistor channel that extends between a source region to be subsequently formed in the substrate (9, 10) and a drain region to be subsequently formed in an upper portion of the memory opening 49.

A memory cavity 49' is present in the unfilled portion of the memory opening 49 above the pedestal channel portion 11. In one embodiment, the pedestal channel portion 11 can comprise single crystalline silicon. Alternatively, the pedestal channel portion 11 can comprise amorphous silicon or polysilicon. In one embodiment, the pedestal channel portion 11 can be substantially free of germanium upon formation. As used herein, a structural element is "substantially free of" an atomic element if the atomic concentration of the atomic element within the structural element is less than 1 parts per million (1 p.p.m.). The atomic concentration of germanium in the pedestal channel portion 11 may be less than 0.1 p.p.m. and/or less than 0.01 p.p.m. upon formation of the pedestal channel portion 11. If a semiconductor material layer 10 is not present, the pedestal channel portion 11 can be formed directly on the substrate semiconductor layer 9, which can have a doping of the first conductivity type.

Figure 5C:
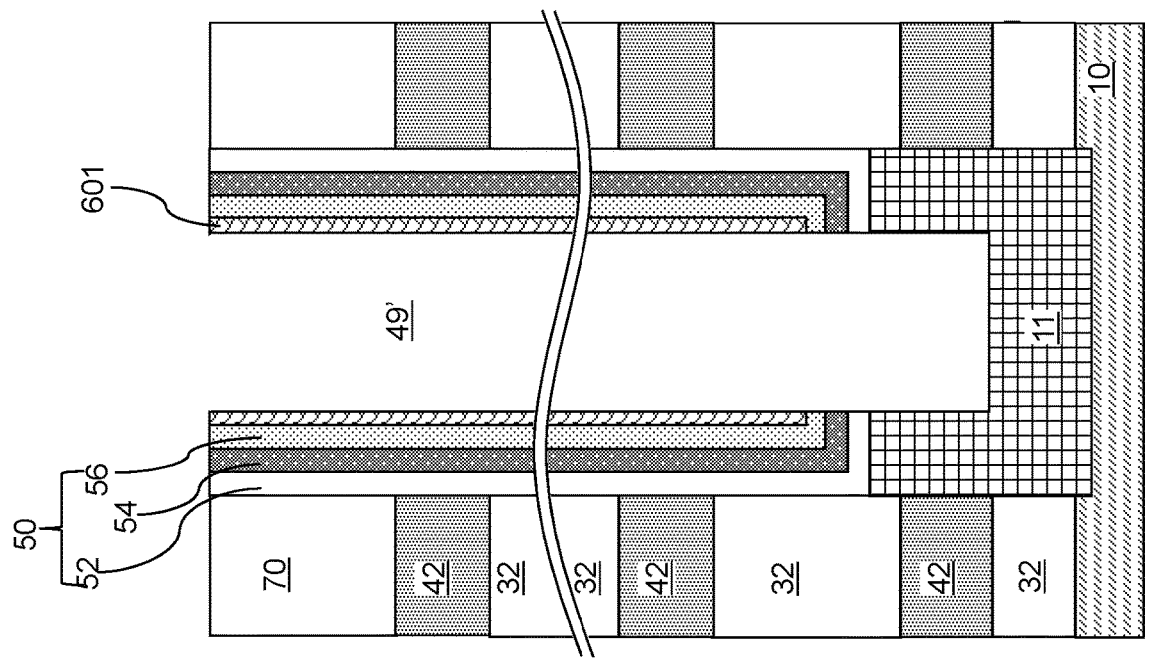

Referring to FIG. 5C, a stack of layers including a blocking dielectric layer 52, a charge storage layer 54, a tunneling dielectric layer 56, and an optional silicon-containing seed layer 601 can be sequentially deposited in the memory openings 49. The stack of layers (52, 54, 56) constitute a memory film that includes material portions that stores data for the memory device to be formed.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer. As used herein, a first surface and a second surface are vertically coincident with each other if the second surface overlies or underlies the first surface and if there exists a vertical plane including the first surface and the second surface.

In another embodiment, the sacrificial material layers 42 can be laterally recessed with respect to the sidewalls of the insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional silicon-containing seed layer 601 includes amorphous silicon or polysilicon. The optional silicon-containing seed layer 601 can include silicon atoms at an atomic concentration greater than 99%, and can be formed directly on an inner sidewall of the tunneling dielectric layer 56. In one embodiment, the silicon-containing seed layer 601 can include silicon atoms at an atomic concentration greater than 99.9%, and may consist essentially of silicon. The silicon-containing seed layer 601 can be formed by a conformal deposition method such as low pressure chemical vapor deposition (LPCVD). The thickness of the silicon-containing seed layer 601 can be in a range from 1 nm to 6 nm, such as from 1.5 nm to 4 nm, although lesser and greater thicknesses can also be employed. A memory cavity 49' is formed in the volume of each memory opening 49 that is not filled with the deposited material layers (52, 54, 56, 601). The optional silicon-containing seed layer 601, if present, provides a substantially vertical cylindrical nucleation surface for a silicon-germanium alloy layer to be subsequently deposited.

Alternatively, the optional silicon-containing seed layer 601 can include a silicon-germanium alloy material including silicon at an atomic concentration greater than 75% and including germanium at an atomic concentration greater than 1%. For example, the atomic concentration of germanium can be in a range from 1% to 20%, such as from 5% to 15%. In this case, limiting the atomic concentration of germanium atoms below 25%, and preferably below 20%, helps formation of a smooth inner sidewall for the optional silicon-containing seed layer 601, and to avoid bumpiness of the surface of the optional silicon-containing seed layer 601 and formation of holes within the optional silicon-containing seed layer 601. Thus, by limiting the atomic percentage of germanium atoms below 25%, and preferably below 20%, formation of a silicon seed layer may be circumvented and the amount of silicon atoms in the memory opening can be reduced compared to an embodiment in which the optional silicon-containing seed layer 601 consists essentially of silicon.

Figure 5D:
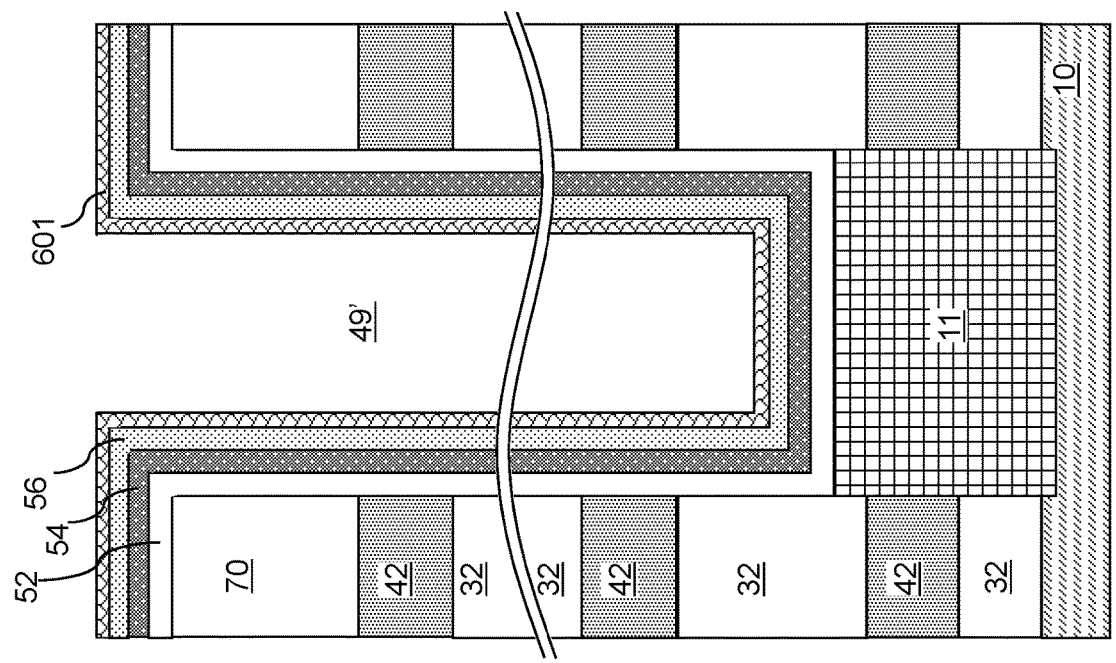

Referring to FIG. 5D, the optional silicon-containing seed layer 601, the tunneling dielectric layer 56, the charge storage layer 54, the blocking dielectric layer 52 are sequentially anisotropically etched employing at least one anisotropic etch process. The portions of the silicon-containing seed layer 601, the tunneling dielectric layer 56, the charge storage layer 54, and the blocking dielectric layer 52 located above the top surface of the insulating cap layer 70 can be removed by the at least one anisotropic etch process. Further, the horizontal portions of the silicon-containing seed layer 601, the tunneling dielectric layer 56, the charge storage layer 54, and the blocking dielectric layer 52 at a bottom of each memory cavity 49' can be removed to form openings in remaining portions thereof. Thus, an opening through the layer stack of the silicon-containing seed layer 601, the tunneling dielectric layer 56, the charge storage layer 54, and the blocking dielectric layer 52 can be formed through a bottom portion of the memory film within each memory opening. Each of the silicon-containing seed layer 601, the tunneling dielectric layer 56, the charge storage layer 54, and the blocking dielectric layer 52 can be etched by a respective anisotropic etch process employing a respective etch chemistry, which may, or may not, be the same for the various material layers.

Each remaining portion of the silicon-containing seed layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region. The optional silicon-containing seed layer 601, if present, protects surfaces of the tunneling dielectric layer 56 during the anisotropic etch process. In other words, a predominant portion of reaction ion etch damage is sustained by the silicon-containing seed layer 601 if the silicon-containing seed layer 601 is present, and any reactive ion etch damage on the tunneling dielectric layer 56 is minimized.

A surface of the pedestal channel portion 11 (or a surface of the semiconductor material layer 10 in case the pedestal channel portions 11 are not employed) can be physically exposed underneath the opening through the silicon-containing seed layer 601, the tunneling dielectric layer 56, the charge storage layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not employed) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (as embodied as the charge storage layer 54) that are insulated from surrounding materials by the blocking dielectric layer 52 and the tunneling dielectric layer 56. In one embodiment, the silicon-containing seed layer 601, the tunneling dielectric layer 56, the charge storage layer 54, and the blocking dielectric layer 52 can have vertically coincident sidewalls.

Referring to FIG. 5E, a silicon-germanium alloy layer 602 can be deposited directly on the semiconductor surface of the pedestal channel portion 11 (or the semiconductor material layer 10 if the pedestal channel portion 11 is omitted), and directly on the silicon-containing seed layer 601 (or inner sidewalls of the tunneling dielectric layer 56 in case the silicon-containing seed layer 601 is omitted). Generally, the silicon-germanium alloy layer 602 can be formed within each memory opening 49 and within each support opening 19 over a respective tunneling dielectric layer 56. The silicon-germanium alloy layer 602 includes a silicon-germanium alloy material, which includes germanium at an atomic concentration less than 25%, and preferably less than 20%, such as 5 to 15 atomic %. The balance of the material composition in the silicon-germanium alloy material can consist essentially of silicon and optionally at least one electrical dopant (such as a p-type dopant or an n-type dopant). In one embodiment, the silicon-germanium alloy layer consists essentially of silicon atoms, germanium atoms, and dopant atoms selected from n-type dopant atoms and p-type dopant atoms and having an atomic concentration less than 1.0%. The silicon-germanium alloy layer 602 can be amorphous or polycrystalline. The silicon-germanium alloy layer 602 can be formed by a conformal deposition method such as low pressure chemical vapor deposition (LPCVD). The conformal deposition method can employ a silicon precursor such as silane, disilane, or dichlorosilane and a germanium precursor such as germane or digermane. The thickness of the silicon-germanium alloy layer 602 can be in a range from 2 nm to 20 nm, although lesser and greater thicknesses can also be employed. As in the case of the silicon-containing seed layer 601, by limiting the atomic percentage of germanium atoms below 25%, and preferably below 20%, within the silicon-germanium alloy layer 602, bumpiness of the surface of the silicon-germanium alloy layer 602 can be avoided and inner sidewalls of the silicon-germanium alloy layer 602 can be formed as smooth vertical cylindrical surfaces.

Formation of smooth surfaces in germanium deposition or a silicon-germanium alloy deposition with a high germanium atomic percentage, such as an atomic percentage of germanium higher than 25% (for example, an atomic percentage in a range from 35% to 99%) is very challenging due to inherent film morphology that induces rough surfaces at such high level of germanium concentration. Consequently, a silicon-germanium alloy film having an atomic concentration of germanium greater than 25% has significant thickness non-uniformity. In contrast, deposition of a silicon-germanium alloy film with an atomic concentration of germanium less than 25%, and preferably less than 20%, tends to provide a flat growth surface and a uniform film thickness, which are advantageously employed according to an embodiment of the present disclosure to provide the silicon-germanium alloy layer 602 with a uniform thickness throughout.

Optionally, a silicon cap layer 603 can be deposited over the silicon-germanium alloy layer 602. The optional silicon cap layer 603 can consist essentially of silicon and any residual dopant atoms, if any, that are unintentionally incorporated during a deposition process. For example, the optional silicon cap layer 603 can include silicon at an atomic concentration greater than 99.8%. The optional silicon cap layer 603 can be formed by a conformal deposition process such as low pressure chemical vapor deposition process. The thickness of the optional silicon cap layer 603 can be in a range from 1 nm to 3 nm, although lesser and greater thicknesses can also be employed. The optional silicon cap layer 603 may be amorphous or polycrystalline. A memory cavity 49' that vertically extend through each sacrificial material layer 42 other than one or more bottommost sacrificial material layers 42 of the alternating stack (32, 42) can be present within each memory opening 49 after deposition of the silicon-germanium alloy layer 602 and the optional silicon cap layer 603. The silicon material of the optional silicon cap layer 603 can subsequently function as an oxygen scavenger material during a subsequent germanium condensation process.

Referring to FIG. 5F, an oxidation process is performed to convert portions of the optional silicon cap layer 603, the silicon-germanium alloy layer 602, and the silicon-containing seed layer 601 into a semiconductor oxide layer 621. The oxidation process that forms the semiconductor oxide layer 621 can include a thermal oxidation process. In the thermal oxidation process, the exemplary structure can be annealed in an oxidizing environment, i.e., within an ambient including at least one oxidizing gas such as oxygen and/or water vapor. Silicon atoms are preferentially incorporated into the silicon-germanium oxide material and germanium atoms are preferentially diffused into the unoxidized remaining material portion of the silicon-germanium alloy layer 602 in the oxidation process.

Specifically, silicon atoms in the optional silicon cap layer 603, the silicon-germanium alloy layer 602, and the silicon-containing seed layer 601 are gradually oxidized to form a semiconductor oxide layer 621, while germanium atoms in the silicon-germanium alloy layer 602 and the silicon-containing seed layer 601, if any, migrate away from the semiconductor oxide layer to form a germanium rich silicon-germanium alloy layer 604. Formation of silicon oxide produces more reduction in thermodynamic enthalpy compared to formation of germanium oxide or maintaining a silicon-germanium bond. Thus, silicon atoms in the optional silicon cap layer 603, the silicon-germanium alloy layer 602, and the silicon-containing seed layer 601 diffuse toward the semiconductor oxide layer 621 and incorporated into the semiconductor oxide layer 621 instead of maintaining a covalent bond with germanium atoms or forming a germanium oxide material. The phenomenon of preferential oxidation of silicon over germanium from a silicon-germanium alloy is known as germanium condensation, and is described, for example, in S. Nakaharai et al., "Formation process of high-purity Ge-on-insulator layers by Ge-condensation technique," Journal of Applied Physics, 105, 024515 (2009).

The initial silicon to germanium ratio in the semiconductor oxide layer 621 can be greater than 10, and may be greater than 100 during an initial phase in which the silicon cap layer 603 is oxidized. In case the silicon cap layer 603 is not employed, the initial silicon to germanium ratio in the silicon oxide layer 621 can be greater than 4, and may be greater than 20 during an initial phase in which the silicon-germanium alloy layer 602 is oxidized. In one embodiment, the semiconductor oxide layer 621 can be a pure silicon oxide layer which contains no germanium or only a trace amount of germanium.

The oxidation process can proceed at a temperature or at temperatures that is lower than the melting point of the germanium rich silicon-germanium alloy layer 604 as its germanium concentration increases during the oxidation process. In one embodiment, the thermal oxidation process is performed in multiple steps with different oxidation temperatures that decrease with progression of the thermal oxidation process as the germanium concentration increases in layer 604 during the oxidation process. In one embodiment, alternating oxidation and annealing steps are performed in which the annealing steps are conducted in an oxygen free ambient (e.g., in vacuum or inert gas ambient). The oxidation and optional annealing steps can be performed at sequentially decreasing temperatures in a range from 1100 degrees Celsius to 800 degrees Celsius. In one embodiment, the oxidation temperature of the last step of the thermal oxidation process can be in a range from 800 degrees Celsius to 937 degrees Celsius, since the melting temperature of pure germanium is 938 degrees Celsius. Alternatively, the oxidation temperature of a single temperature oxidation process can be in a range from 800 degrees Celsius to 937 degrees Celsius.

As the oxidation process progresses, the germanium concentration in unoxidized remaining materials from the optional silicon cap layer 603, the silicon-germanium alloy layer 602, and the silicon-containing seed layer 601 increases due to preferential incorporation of silicon into the semiconductor oxide layer 621. Correspondingly, the silicon to germanium ratio at the interfacial regions of the semiconductor oxide layer 621 gradually decreases as the oxidation process proceeds, and the semiconductor oxide layer 621 (which include oxidized portions of the silicon-germanium alloy layer 602) includes a silicon oxide or a silicon-germanium oxide material.

Optionally, germanium atoms may diffuse from the silicon-germanium alloy layer 602 and from the silicon-containing seed layer 601 (in case the silicon-containing seed layer 601 includes a silicon-germanium alloy) into the pedestal channel portion 11 during the oxidation process. A graded silicon-germanium alloy region 11B can be formed in a portion of the pedestal channel portion 11 that is proximal to the silicon-germanium alloy layer 602. The graded silicon-germanium alloy region 11B can include a graded silicon-germanium alloy material having a maximum atomic concentration of germanium that is less than the atomic concentration of germanium in the silicon-germanium alloy layer 602 as initially formed. The germanium concentration decreases within the graded silicon-germanium alloy region 11B with a distance from the interface between the silicon-germanium oxide material of the silicon-germanium alloy layer 602 and the graded silicon-germanium alloy region 11B. The remaining portion of the pedestal channel portion 11 that includes germanium at an atomic concentration less than 1.0% is herein referred to as a silicon-based pedestal channel portion 11A.

Figure 5H:
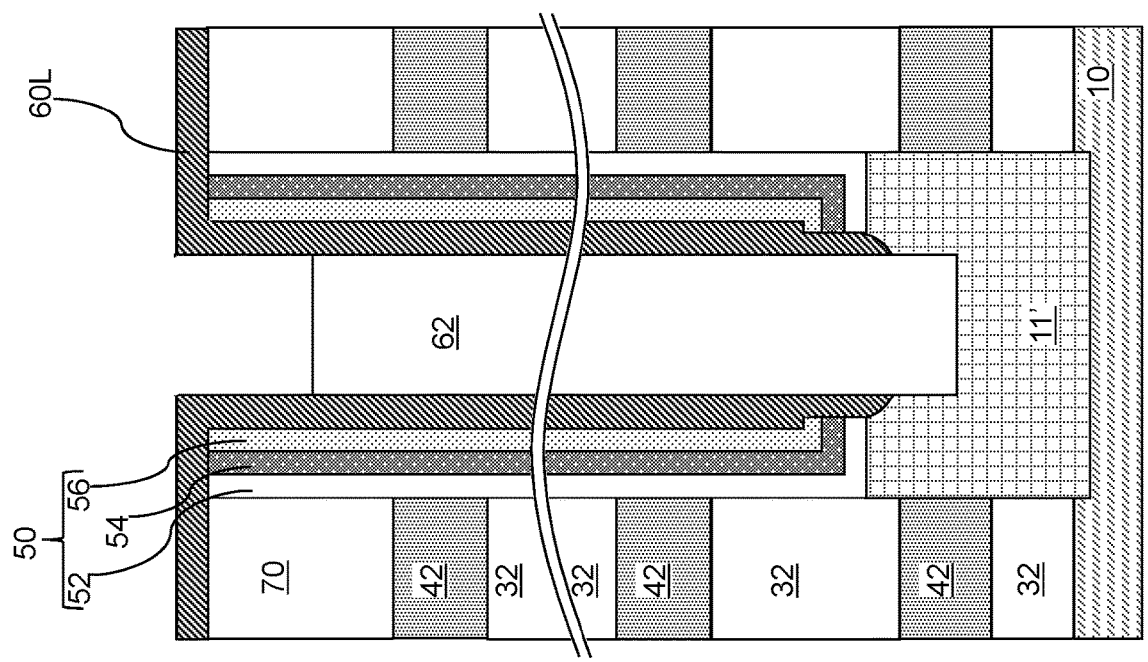
Figure 5G:
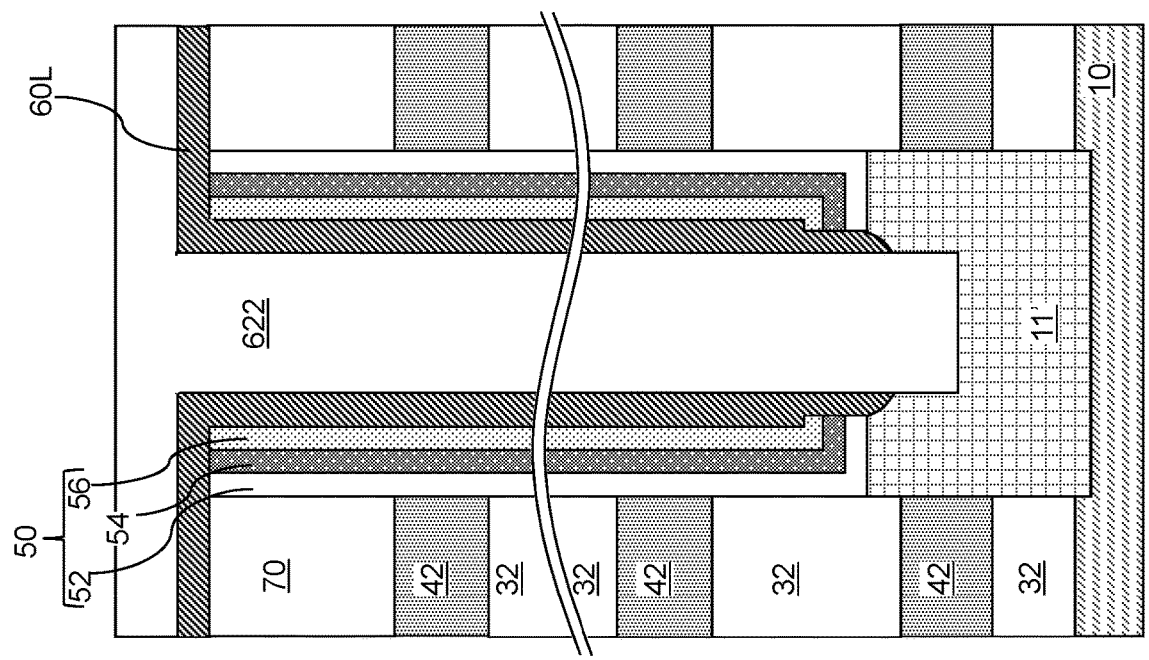

Referring to FIG. 5G, the oxidation process proceeds until a semiconductor channel layer 60L including an unoxidized remaining portion of the germanium rich silicon-germanium alloy layer 604 includes germanium at an atomic concentration greater than 50%. In one embodiment, the selective incorporation of silicon into the semiconductor oxide layer 621 can proceed until the atomic concentration of germanium atoms in remaining germanium rich silicon-germanium alloy layer 604 is greater than 50%, and/or greater than 60%, and/or greater than 70%, and/or greater than 80%, and/or greater than 90%, and/or greater than 95%, and/or greater than 98%, and/or greater than 99%. In one embodiment, the semiconductor channel layer 60L includes germanium atoms at an atomic concentration greater than 99%, such as 99.1 to 99.9% (e.g., the semiconductor channel layer may be a pure germanium layer with unavoidable impurities and p-type or n-type dopants).

The semiconductor oxide layer 621 grows into a semiconductor oxide core layer 622 including a continuous horizontal portion overlying each of the memory openings 49 and support openings 19 and as many vertically extending portions as the total number of memory openings 49 and the support openings 19. The semiconductor oxide core layer 622 can completely fill the cavities in the memory openings 49 and the support openings 19. In one embodiment, the semiconductor oxide core layer 622 is a silicon oxide layer and the semiconductor channel layer 60L is a germanium layer with a sharp boundary located between them. In another embodiment, the semiconductor oxide core layer 622 is a silicon-germanium oxide layer and the semiconductor channel layer 60L is a silicon-germanium layer. In this embodiment, because incorporation rate of germanium gradually increases with progression of the oxidation process that forms the semiconductor oxide core layer 622, the concentration of germanium can increase with a radial distance from the geometrical center of each vertically-extending portion of the semiconductor oxide core layer 622 within each memory opening 49.

The graded silicon-germanium alloy region 11B can continue to grow as germanium atoms continue to diffuse outward during the growth of the semiconductor oxide layer 621 and formation of the semiconductor oxide core layer 622. In one embodiment, the graded silicon-germanium alloy region 11B can expand in volume until the graded silicon-germanium alloy region 11B grows into the entire volume of the pedestal channel portion 11. Thus, the pedestal channel portion 11' after diffusion of germanium thereinto can be a silicon-germanium alloy pedestal channel portion with a germanium concentration gradient therein.

Referring to FIG. 5H, the horizontal portion of the semiconductor oxide core layer 622 overlying the horizontal portion of the semiconductor channel layer 60L can be removed, for example, by a recess etch. Each remaining portion of the semiconductor oxide core layer 622 constitutes a semiconductor oxide core 62 (e.g., silicon oxide or silicon-germanium oxide core) located in a respective one of the memory openings 49 or in a respective one of the support openings 19. The recess etch can be prolonged to recess the top portion of each semiconductor oxide core 62 so that the recessed top surface of each semiconductor oxide core 62 is located between a horizontal plane including the bottom surface of the insulating cap layer 70 and a horizontal plane including the top surface of the insulating cap layer 70.

Referring to FIG. 5I, at least a horizontal portion of the semiconductor channel layer 60L overlying the insulating cap layer 70 can be removed by a recess etch, which may include an anisotropic etch process or an isotropic etch process. Each remaining portion of the semiconductor channel layer 60L in a memory opening 49 or in a support opening 19 constitutes a vertical semiconductor channel 60. Each vertical semiconductor channel 60 can have a cylindrical configuration. The outer surface of each vertical semiconductor channel 60 contacts a respective tunneling dielectric layer 56 at a smooth vertical interface. The inner surface of each vertical semiconductor channel 60 contacts a respective semiconductor oxide core 62 at a smooth vertical interface. Thus, each vertical semiconductor channel 60 can include a cylindrical region having a uniform thickness that is invariant with translation along the vertical direction and with an azimuthal rotation (i.e., a rotation around the vertical direction).

Electrical current can flow through a vertical semiconductor channel 60 when a vertical NAND device including the vertical semiconductor channel 60 is turned on. Each adjoining set of a blocking dielectric layer 52, a charge storage layer 54, and a tunneling dielectric layer 56 collectively constitute a memory film 50, which can store electrical charges with a macroscopic retention time. A tunneling dielectric layer 56 is surrounded by a charge storage layer 54, and laterally surrounds a portion of the vertical semiconductor channel 60. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Referring to FIG. 5J, drain regions 63 can be formed by depositing a doped semiconductor material within each recessed region above the semiconductor oxide cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{19}/cm^3$ to $2.0 \times 10^{21}/cm^3$, although lesser and greater dopant concentrations can also be employed. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Each combination of a memory film 50 and a vertical semiconductor channel 60 within a memory opening 49 constitutes a memory stack structure 55. The memory stack structure 55 is a combination of a vertical semiconductor channel 60, a tunneling dielectric layer 56, a plurality of memory elements comprising portions of the charge storage layer 54, and an optional blocking dielectric layer 52. Each combination of a pedestal channel portion 11', a memory stack structure 55, a semiconductor oxide core 62, and a drain region 63 within a memory opening 49 is herein referred to as a memory opening fill structure 58. Each combination of a pedestal channel portion 11', a memory film 50, a vertical semiconductor channel 60, a semiconductor oxide core 62, and a drain region 63 within each support opening 19 fills the respective support openings 19, and constitutes a support pillar structure.

The silicon oxide or silicon-germanium oxide material formed by oxidation forms a semiconductor oxide core 62 having a pillar shape with a vertical axis VA passing through a geometrical center GC of the semiconductor oxide core 62. As used herein, a geometrical center of a structural element refers to the center of mass of a hypothetical structural element that occupies an identical volume as the structural element and having a uniform density throughout. If the semiconductor oxide core 62 is a silicon-germanium oxide core, then in one embodiment the atomic concentration of silicon atoms decreases with a radial distance from the vertical axis VA. In one embodiment, the entire volume of each memory opening 49 can be filled with a combination of a pedestal channel portion 11', a memory film 50, a vertical semiconductor channel 60, and a semiconductor oxide core 62. In one embodiment, the semiconductor oxide core 62 has a pillar shape with a vertical axis VA passing through a geometrical center GC of the semiconductor oxide core 62, and the atomic concentration of silicon atoms decreases with a radial distance from the vertical axis VA. In one embodiment, the ratio of the atomic concentration of silicon to the atomic concentration of germanium is greater than 10 at the geometrical center, and is less than 0.5 at an interface between the semiconductor oxide core 62 and the vertical semiconductor channel 60. In one embodiment, the semiconductor oxide core 62 consists essentially of silicon atoms, germanium atoms, oxygen atoms, and dopant atoms selected from n-type dopant atoms and p-type dopant atoms and having an atomic concentration less than 0.5%.

In one embodiment, the lateral dimensions of the memory openings 49 and the thicknesses of the optional silicon-containing seed layer 601, the silicon-germanium alloy layer 602, and the optional silicon cap layer 603 can be selected such that the semiconductor oxide core 62 completely fills the entire volume of the memory cavity located inside the vertical semiconductor channel 60.

FIGS. 6A-6H illustrate structural changes in a memory opening 49 during formation of a memory opening fill structure of a second configuration. The memory opening 49 illustrated in FIGS. 6A-6H can be one of the memory openings 49 in the exemplary structure of FIGS. 4A and 4B. The same structural change occurs simultaneously in each of the other memory openings 49 and in each support opening 19.

Referring to FIG. 6A, a stack of layers including a blocking dielectric layer 52, a charge storage layer 54, a tunneling dielectric layer 56, and an optional silicon-containing seed layer 601 can be deposited in a memory opening 49 illustrated in FIG. 5A without forming a pedestal channel portion 11. Each of the blocking dielectric layer 52, the charge storage layer 54, the tunneling dielectric layer 56, and the optional silicon-containing seed layer 601 can be structurally and compositionally the same as the corresponding layer in FIG. 5C. In this case, the blocking dielectric layer 52 can be formed directly on a top surface of the semiconductor material layer 10.

Referring to FIG. 6B, the optional silicon-containing seed layer 601, the tunneling dielectric layer 56, the charge storage layer 54, the blocking dielectric layer 52 are sequentially anisotropically etched employing at least one anisotropic etch process, which can be the same as in the processing steps of FIG. 5D. Surfaces of the semiconductor material layer 10 can be physically exposed after the at least one anisotropic etch process.

Referring to FIG. 6C, the processing steps of FIG. 5E can be performed to deposit a silicon-germanium alloy layer 602 and an optional silicon cap layer 603. Each of the silicon-germanium alloy layer 602 and the optional silicon cap layer 603 can have the same thickness as, and the same composition as, in the silicon-germanium alloy layer 602 and the optional silicon cap layer 603 illustrated in FIG. 5E.

Referring to FIG. 6D, the processing steps of FIG. 5F can be subsequently performed. The oxidation process converts portions of the optional silicon cap layer 603, the silicon-germanium alloy layer 602, and the silicon-containing seed layer 601 into a semiconductor oxide layer 621 and the germanium rich silicon-germanium alloy layer 604. As the oxidation process progresses, the germanium concentration in unoxidized remaining portion of the germanium rich silicon-germanium alloy layer 604 increases due to preferential incorporation of silicon into the semiconductor oxide layer 621. Correspondingly, the silicon to germanium ratio at the interfacial regions of the semiconductor oxide layer 621 gradually decreases as the oxidation process proceeds, and the semiconductor oxide layer 621 (which include oxidized portions of the silicon-germanium alloy layer 602) includes a silicon-germanium oxide material.

In one embodiment, germanium atoms can diffuse from the silicon-germanium alloy layer 602 and from the silicon-containing seed layer 601 (in case the silicon-containing seed layer 601 includes a silicon-germanium alloy) into an underlying portion of the semiconductor material layer 10 during the oxidation process. A graded silicon-germanium alloy region 102 can be formed in each region underlying a memory film 50. The graded silicon-germanium alloy region 102 can include a graded silicon-germanium alloy material 102 having a maximum atomic concentration of germanium that is less than the atomic concentration of germanium in the silicon-germanium alloy layer 602 as initially formed. The germanium concentration decreases within the graded silicon-germanium alloy region 102 with a distance from the interface between the germanium rich silicon-germanium alloy layer 604 and the graded silicon-germanium alloy region 102.

Referring to FIG. 6E, the oxidation process proceeds until a semiconductor channel layer 60L which includes germanium at an atomic concentration greater than 50% is formed. In one embodiment, the selective incorporation of silicon into the semiconductor oxide layer 621 can proceed until the atomic concentration of germanium atoms in remaining germanium rich silicon-germanium alloy layer 604 (i.e., in the semiconductor channel layer 60L) is greater than 50%, and/or greater than 60%, and/or greater than 70%, and/or greater than 80%, and/or greater than 90%, and/or greater than 95%, and/or greater than 98%, and/or greater than 99%. In one embodiment, the semiconductor channel layer 60L includes germanium atoms at an atomic concentration greater than 99%.

The semiconductor oxide layer 621 grows into a semiconductor oxide core layer 622 including a continuous horizontal portion overlying each of the memory openings 49 and support openings 19 and as many vertically extending portions as the total number of memory openings 49 and the support openings 19. The semiconductor oxide core layer 622 can fill the cavities in the memory openings 49 and the support openings 19.

The graded silicon-germanium alloy region 102 can continue to grow as germanium atoms continue to diffuse outward during the growth of the semiconductor oxide layer 621 and formation of the semiconductor oxide core layer 622 during the oxidation process, and can be terminated when the semiconductor channel layer 60L has a target germanium concentration.

Referring to FIG. 6F, the processing steps of FIG. 5H can be performed. The horizontal portion of the semiconductor oxide core layer 622 overlying the horizontal portion of the semiconductor channel layer 60L can be removed, for example, by a recess etch. Each remaining portion of the semiconductor oxide core layer 622 constitutes a semiconductor oxide core 62 located in a respective one of the memory openings 49 or in a respective one of the support openings 19. The recess etch can be prolonged to recess the top portion of each semiconductor oxide core 62 so that the recessed top surface of each semiconductor oxide core 62 is located between a horizontal plane including the bottom surface of the insulating cap layer 70 and a horizontal plane including the top surface of the insulating cap layer 70.

Referring to FIG. 6G, the processing steps of FIG. 5I can be performed. At least a horizontal portion of the semiconductor channel layer 60L overlying the insulating cap layer 70 can be removed by a recess etch, which may include an anisotropic etch process or an isotropic etch process. Each remaining portion of the semiconductor channel layer 60L in a memory opening 49 or in a support opening 19 constitutes a vertical semiconductor channel 60.

Referring to FIG. 6H, the processing steps of FIG. 5J can be performed. Drain regions 63 can be formed by depositing a doped semiconductor material within each recessed region above the semiconductor oxide cores 62. The drain regions 63 can have a doping of a second conductivity type that is the opposite of the first conductivity type.

Figure 7:
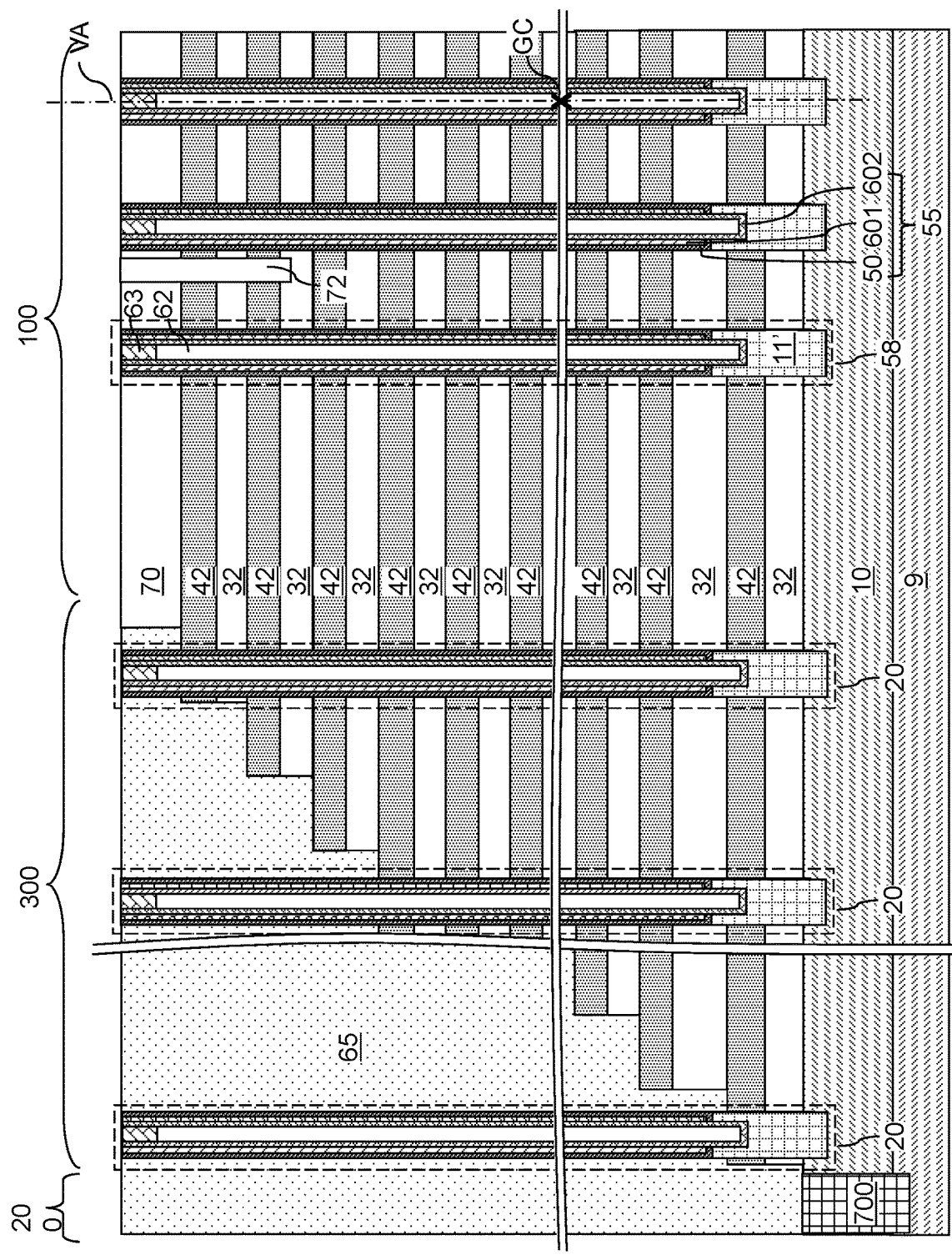
FIG. 7 is a schematic vertical cross-sectional view of the exemplary structure after formation of memory stack structures and support pillar structures according to an embodiment of the present disclosure.

Referring to FIG. 7, the exemplary structure is illustrated after formation of memory opening fill structures 58 and support pillar structures 20 within the memory openings 49 and the support openings 19, respectively. An instance of a memory opening fill structure 58 can be formed within each memory opening 49 of the structure of FIGS. 4A and 4B. An instance of the support pillar structure 20 can be formed within each support opening 19 of the structure of FIGS. 4A and 4B. Each memory opening fill structure 58 and each support pillar structure 20 can have the configuration of FIG. 5J or the configuration of FIG. 6H.

Each memory stack structure 55 includes a vertical semiconductor channel 60 and a memory film 50. The memory film 50 may comprise a tunneling dielectric layer 56 laterally surrounding the vertical semiconductor channel 60 and a vertical stack of charge storage regions laterally surrounding the tunneling dielectric layer 56 (as embodied as a memory material layer 54) and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 8B:
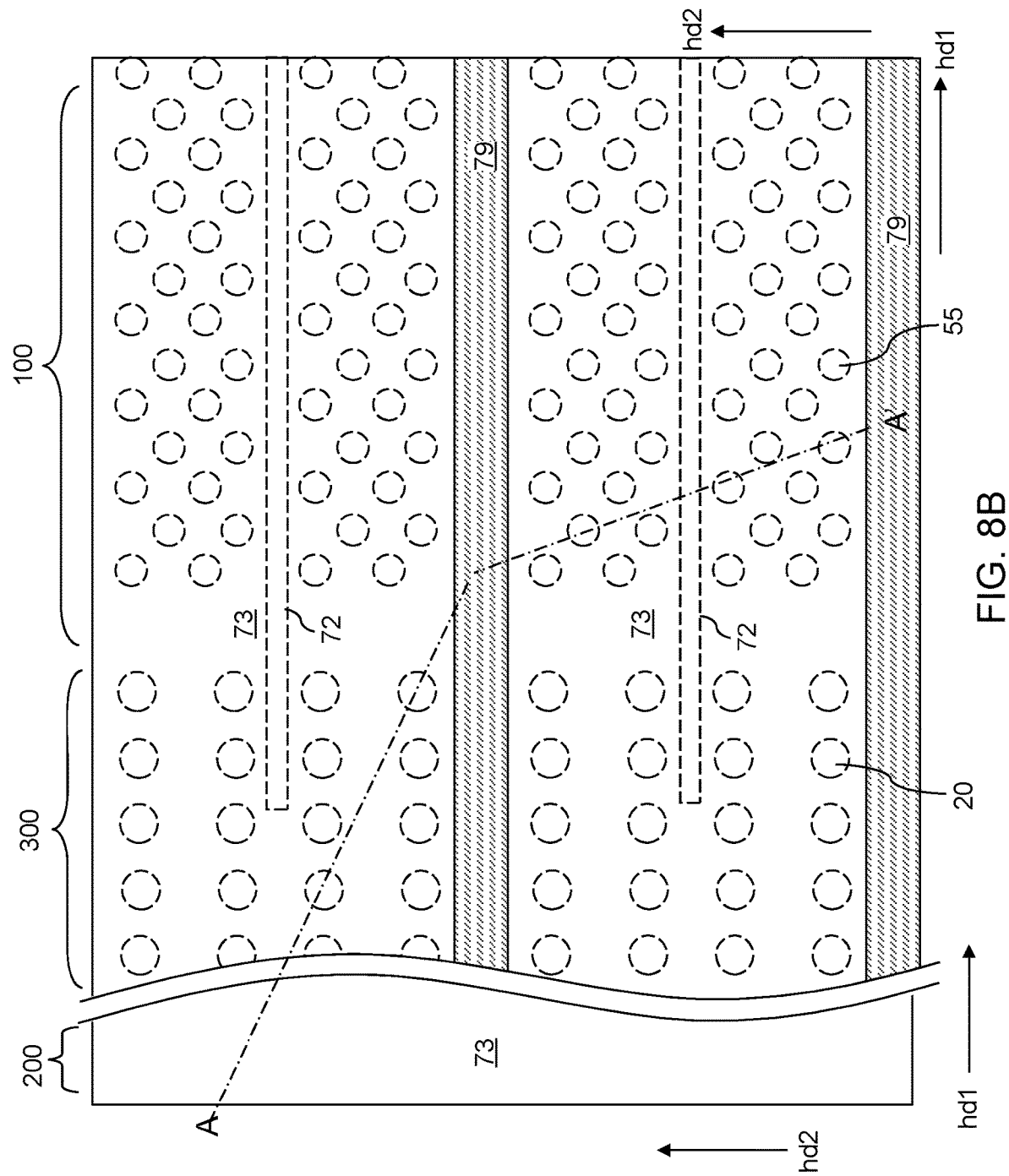
FIG. 8B is a partial see-through top-down view of the exemplary structure of FIG. 8A. The vertical plane A-A' is the plane of the schematic vertical cross-sectional view of FIG. 8A.

Referring to FIGS. 8A and 8B, a contact level dielectric layer 73 can be formed over the alternating stack (32, 42) of insulating layer 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be employed.

A photoresist layer (not shown) can be applied over the contact level dielectric layer 73, and is lithographically patterned to form openings in areas between clusters of memory stack structures 55. The pattern in the photoresist layer can be transferred through the contact level dielectric layer 73, the alternating stack (32, 42) and/or the retro-stepped dielectric material portion 65 employing an anisotropic etch to form backside trenches 79, which vertically extend from the top surface of the contact level dielectric layer 73 at least to the top surface of the substrate (9, 10), and laterally extend through the memory array region 100 and the contact region 300.

In one embodiment, the backside trenches 79 can laterally extend along a first horizontal direction hd1 and can be laterally spaced apart among one another along a second horizontal direction hd2 that is perpendicular to the first horizontal direction hd1. The memory stack structures 55 can be arranged in rows that extend along the first horizontal direction hd1. The drain select level isolation structures 72 can laterally extend along the first horizontal direction hd1. Each backside trench 79 can have a uniform width that is invariant along the lengthwise direction (i.e., along the first horizontal direction hd1). Each drain select level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain select level isolation structure 72, or between a neighboring pair of drain select level isolation structures 72. In one embodiment, the backside trenches 79 can include a source contact opening in which a source contact via structure can be subsequently formed. The photoresist layer can be removed, for example, by ashing.

Figure 9:
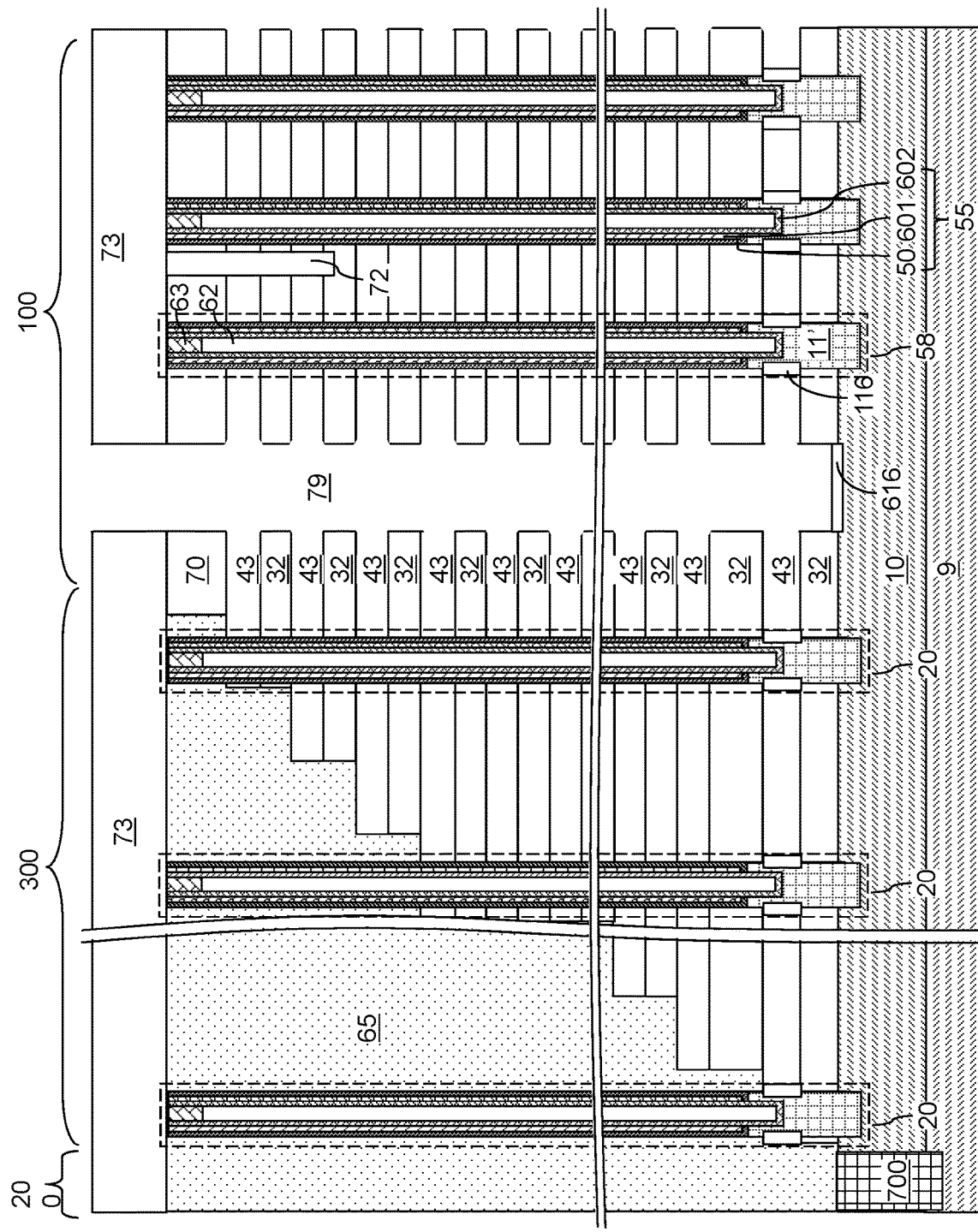
FIG. 9 is a schematic vertical cross-sectional view of the exemplary structure after formation of backside recesses according to an embodiment of the present disclosure.

Referring to FIGS. 9 and 10A, an etchant that selectively etches the second material of the sacrificial material layers 42 with respect to the first material of the insulating layers 32 can be introduced into the backside trenches 79, for example, employing an etch process. FIG. 10A illustrates a region of the exemplary structure of FIG. 9. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Physically exposed surface portions of the optional pedestal channel portions 11' and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11' into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11' and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11'. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Referring to FIG. 10B, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

Referring to FIG. 10C, a metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

Figure 11:
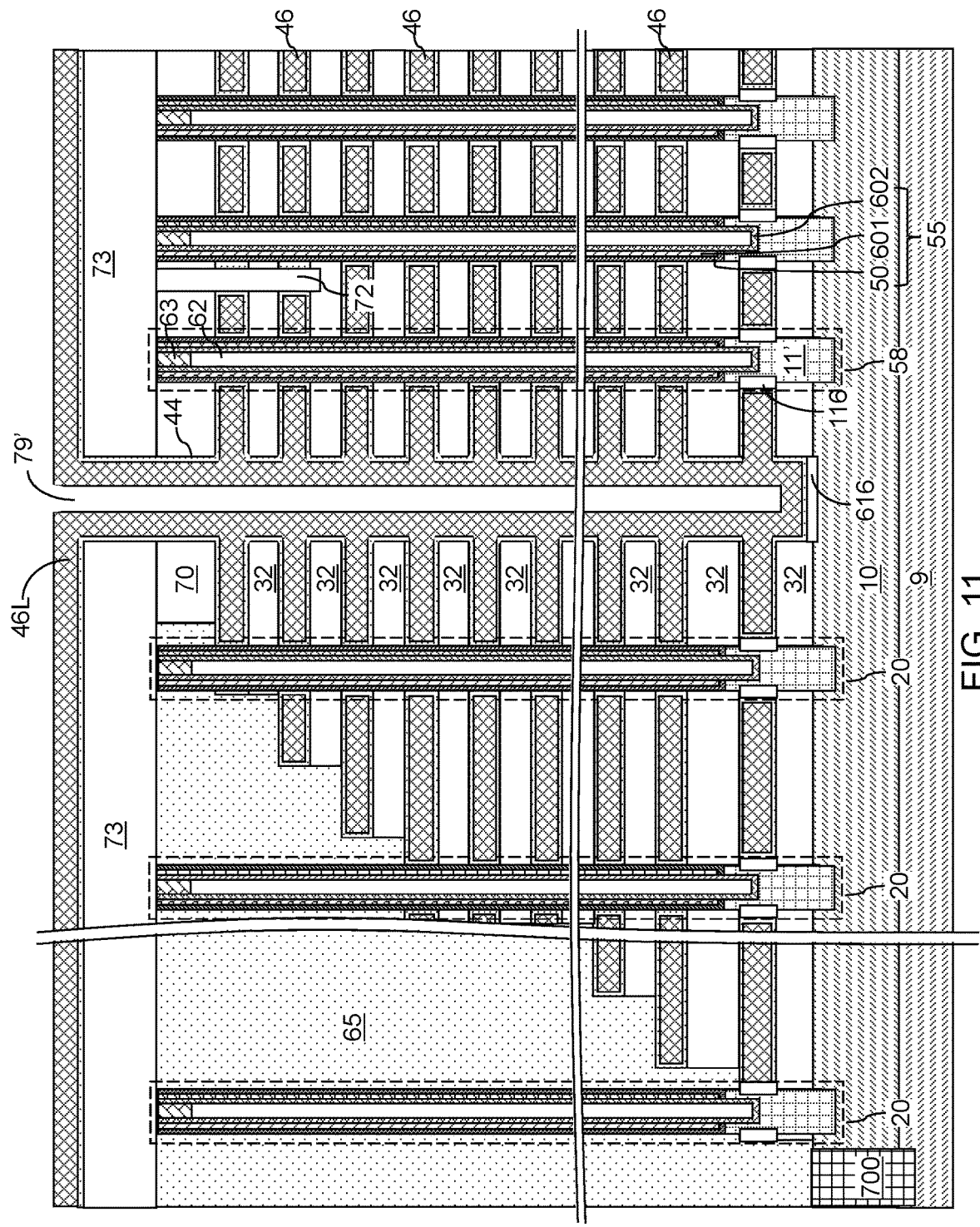
FIG. 11 is a schematic vertical cross-sectional view of the exemplary structure at the processing step of FIG. 10D.

Referring to FIGS. 10D and 11, a metal fill material is deposited in the plurality of backside recesses 43, on the sidewalls of the at least one the backside trench 79, and over the top surface of the contact level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, and a continuous metallic material layer 46L can be formed on the sidewalls of each backside trench 79 and over the contact level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous metallic material layer 46L includes a continuous portion of the metallic barrier layer 46A and a continuous portion of the metallic fill material layer 46B that are located in the backside trenches 79 or above the contact level dielectric layer 73.

Each sacrificial material layer 42 can be replaced with an electrically conductive layer 46. A backside cavity 79' is present in the portion of each backside trench 79 that is not filled with the backside blocking dielectric layer 44 and the continuous metallic material layer 46L. A tubular dielectric spacer 116 laterally surrounds a pedestal channel portion 11'. A bottommost electrically conductive layer 46 laterally surrounds each tubular dielectric spacer 116 upon formation of the electrically conductive layers 46.

Figure 12A:
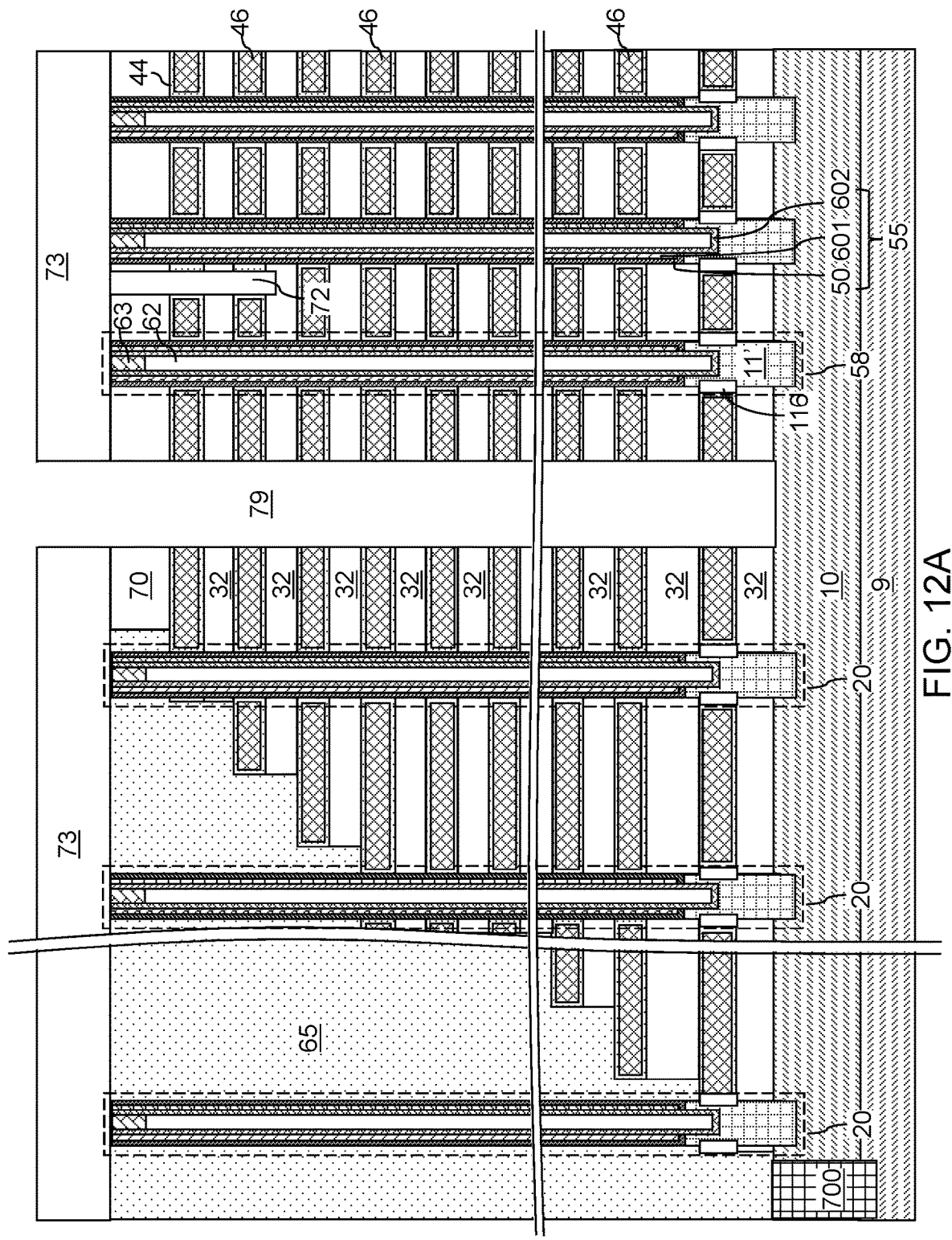
FIGS. 12A and 12C are schematic vertical cross-sectional views of the exemplary structure after removal of a deposited conductive material from within the backside trench according to an embodiment of the present disclosure.
Figure 12B:
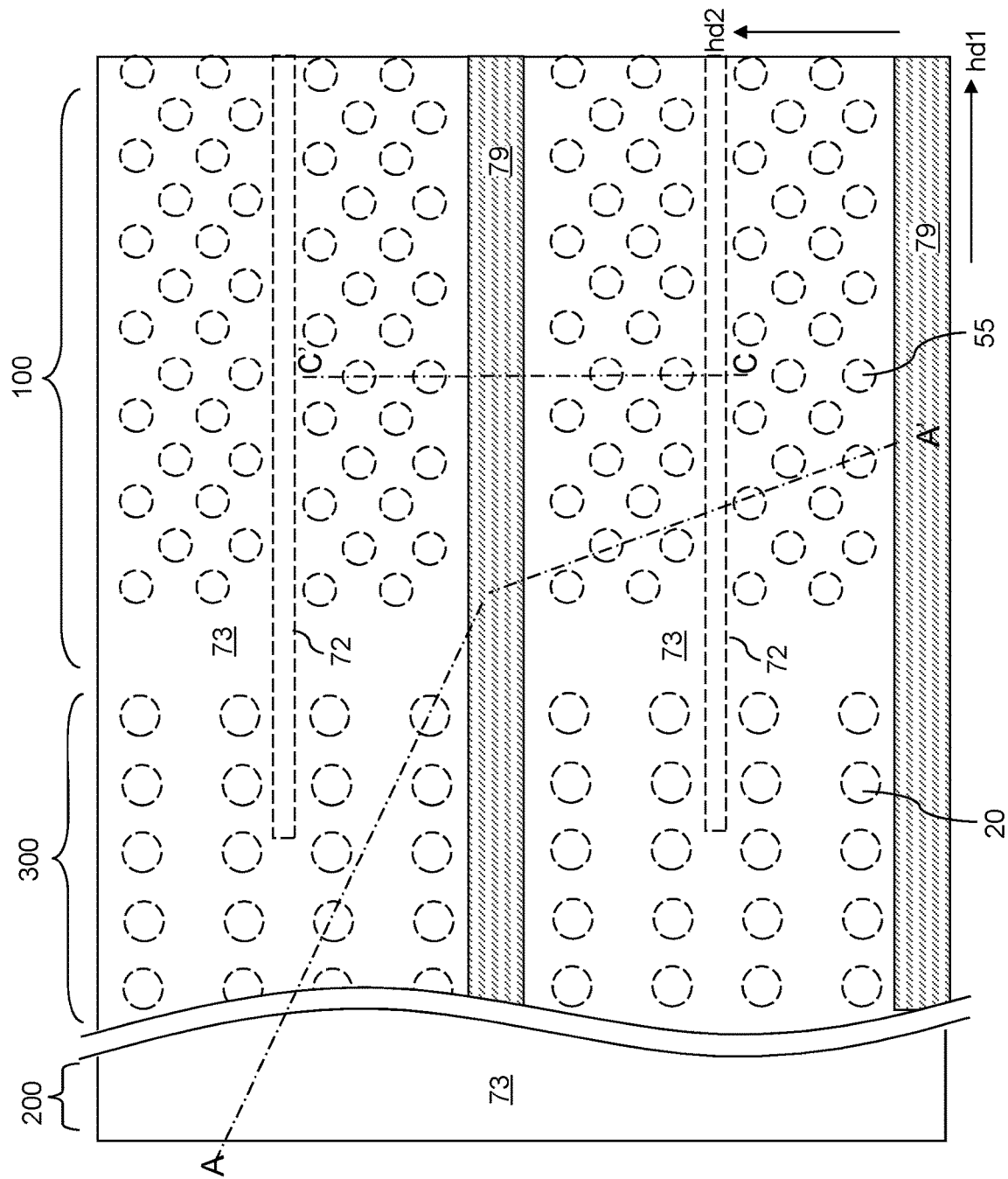
FIG. 12B is a top-down view of the exemplary structure of FIGS. 12A and 12C. The vertical planes A-A' and C-C' are the planes of the schematic vertical cross-sectional views of FIGS. 12A and 12C, respectively.
Figure 12C:
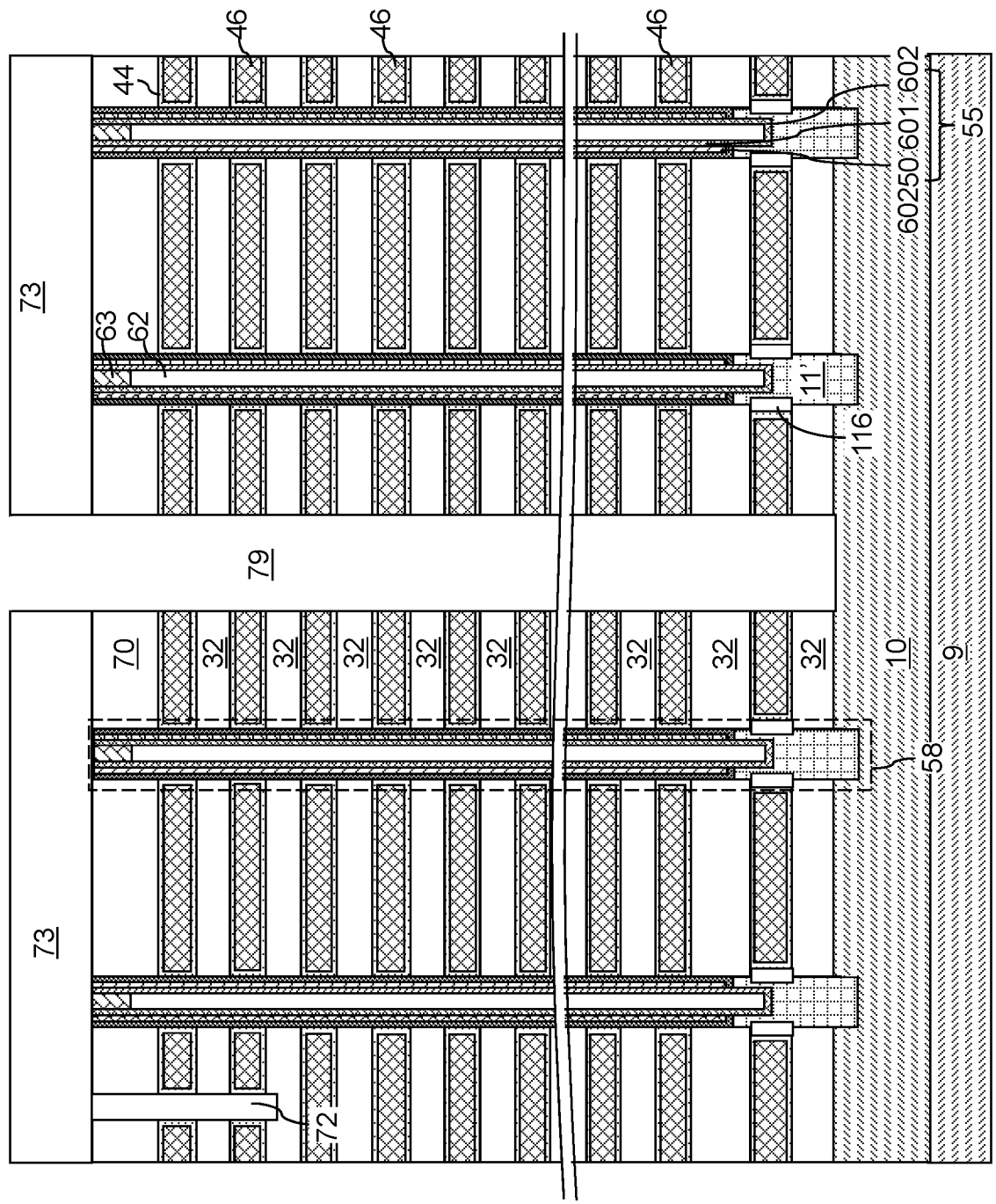

Referring to FIGS. 12A-12C, the deposited metallic material of the continuous electrically conductive material layer 46L is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer 46L may not be selective to the material of the backside blocking dielectric layer 44 or, the backside blocking dielectric layer 44 may not be employed. The planar dielectric portions 616 can be removed during removal of the continuous electrically conductive material layer 46L. A backside cavity 79' is present within each backside trench 79.

Figure 13A:
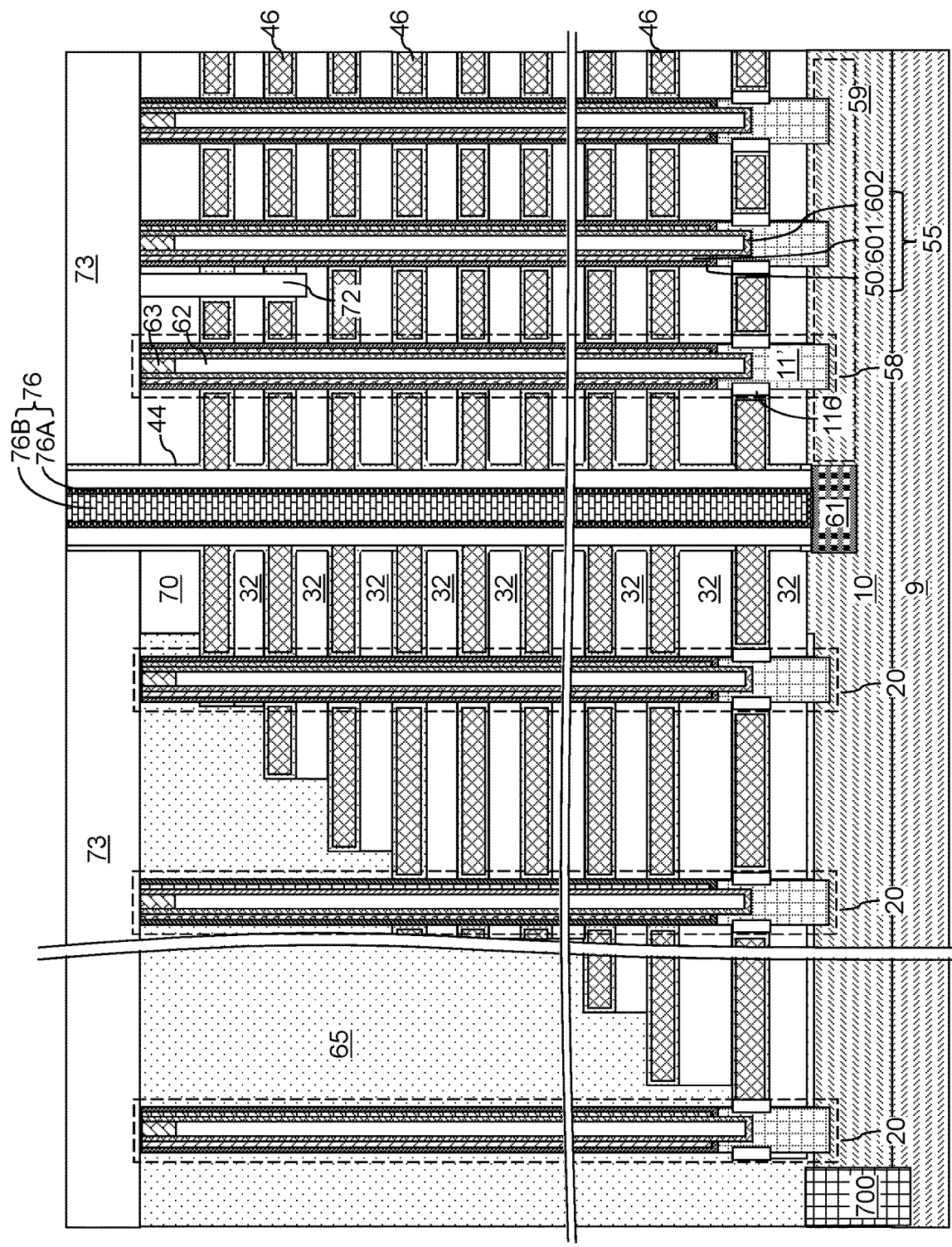
FIG. 13A is a schematic vertical cross-sectional view of the exemplary structure after formation of an insulating spacer and a backside contact structure according to an embodiment of the present disclosure.
Figure 13B:
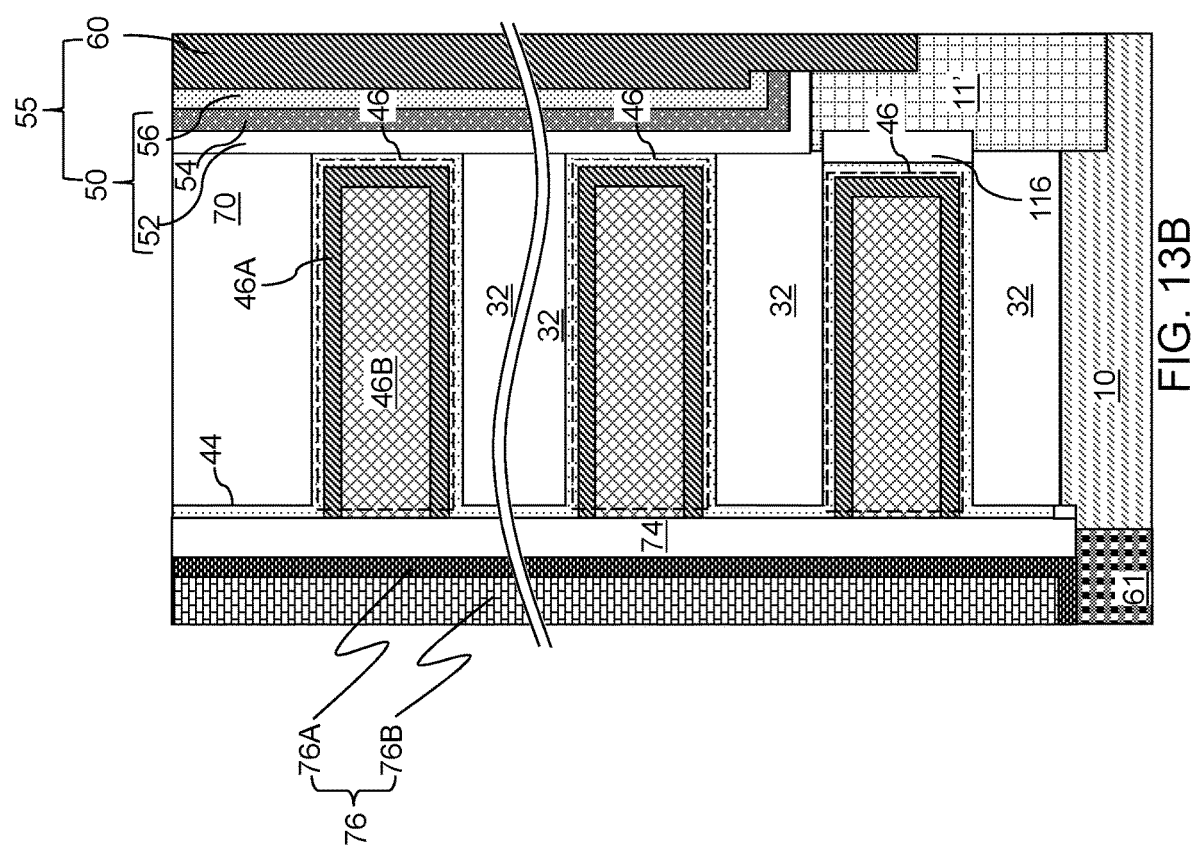
FIG. 13B is a magnified view of a region of the exemplary structure of FIG. 13A.

Referring to FIGS. 13A and 13B, an insulating material layer can be formed in the backside trenches 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not employed, the insulating material layer can be formed directly on sidewalls of the insulating layers 32 and directly on sidewalls of the electrically conductive layers 46.

An anisotropic etch is performed to remove horizontal portions of the insulating material layer from above the contact level dielectric layer 73 and at the bottom of each backside trench 79. Each remaining portion of the insulating material layer constitutes an insulating spacer 74. A backside cavity 79' is present within a volume surrounded by each insulating spacer 74. A top surface of the semiconductor material layer 10 can be physically exposed at the bottom of each backside trench 79.

A source region 61 can be formed at a surface portion of the semiconductor material layer 10 under each backside cavity 79' by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74.

An upper portion of the semiconductor material layer 10 that extends between the source region 61 and the plurality of pedestal channel portions 11' constitutes a horizontal semiconductor channel 59 for a plurality of field effect transistors. The horizontal semiconductor channel 59 is connected to multiple vertical semiconductor channels 60 through respective pedestal channel portions 11'. The horizontal semiconductor channel 59 contacts the source region 61 and the plurality of pedestal channel portions 11'. A bottommost electrically conductive layer 46 provided upon formation of the electrically conductive layers 46 within the alternating stack (32, 46) can comprise a select gate electrode for the field effect transistors. Each source region 61 is formed in an upper portion of the semiconductor substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 can be formed within each backside cavity 79'. Each contact via structure 76 can fill a respective cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact level dielectric layer 73 overlying the alternating stack (32, 46) as a stopping layer. If chemical mechanical planarization (CMP) process is employed, the contact level dielectric layer 73 can be employed as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. If a backside blocking dielectric layer 44 is employed, the backside contact via structure 76 can contact a sidewall of the backside blocking dielectric layer 44.

Figure 14A:
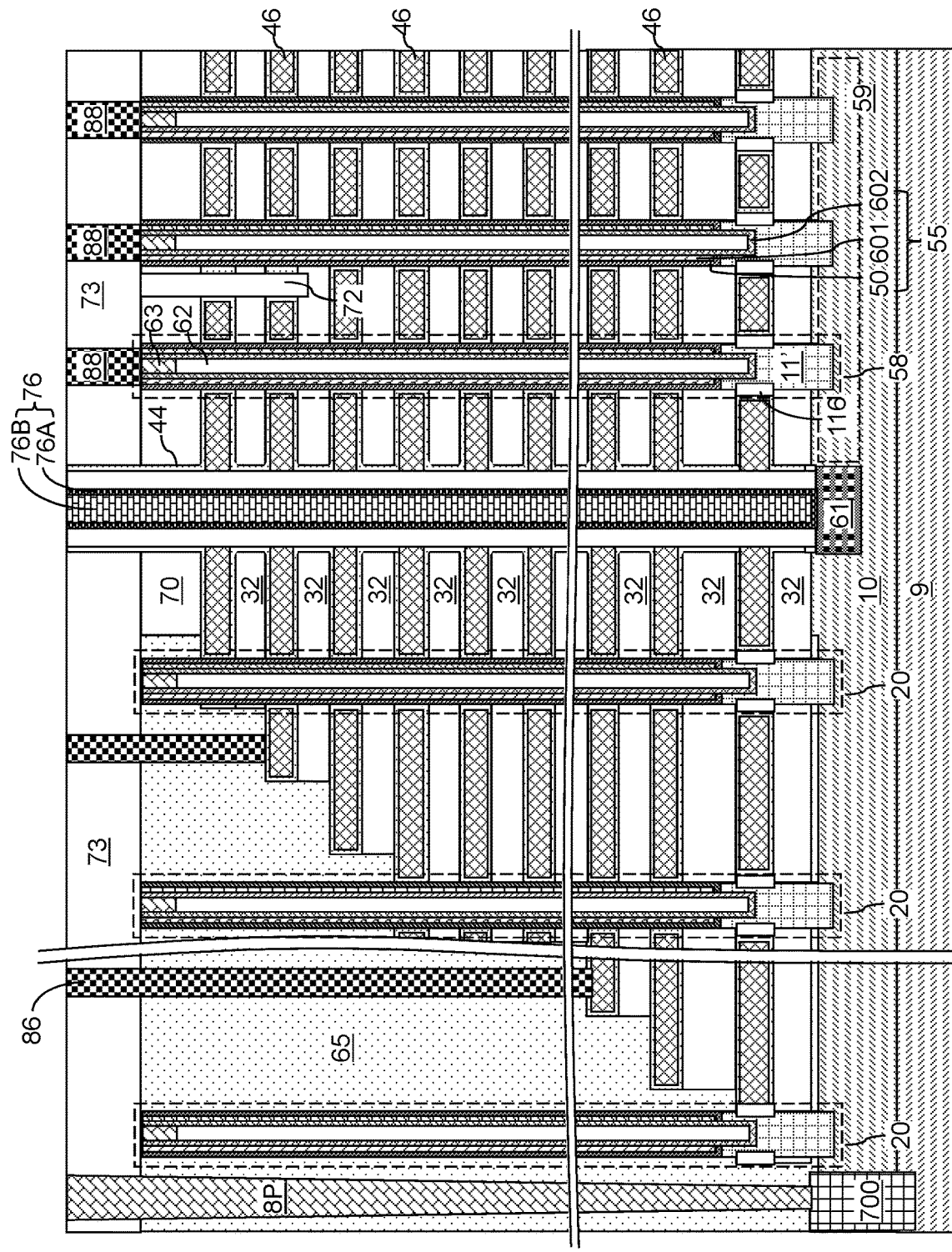
FIG. 14A is a schematic vertical cross-sectional view of the exemplary structure after formation of additional contact via structures according to an embodiment of the present disclosure.
Figure 14B:
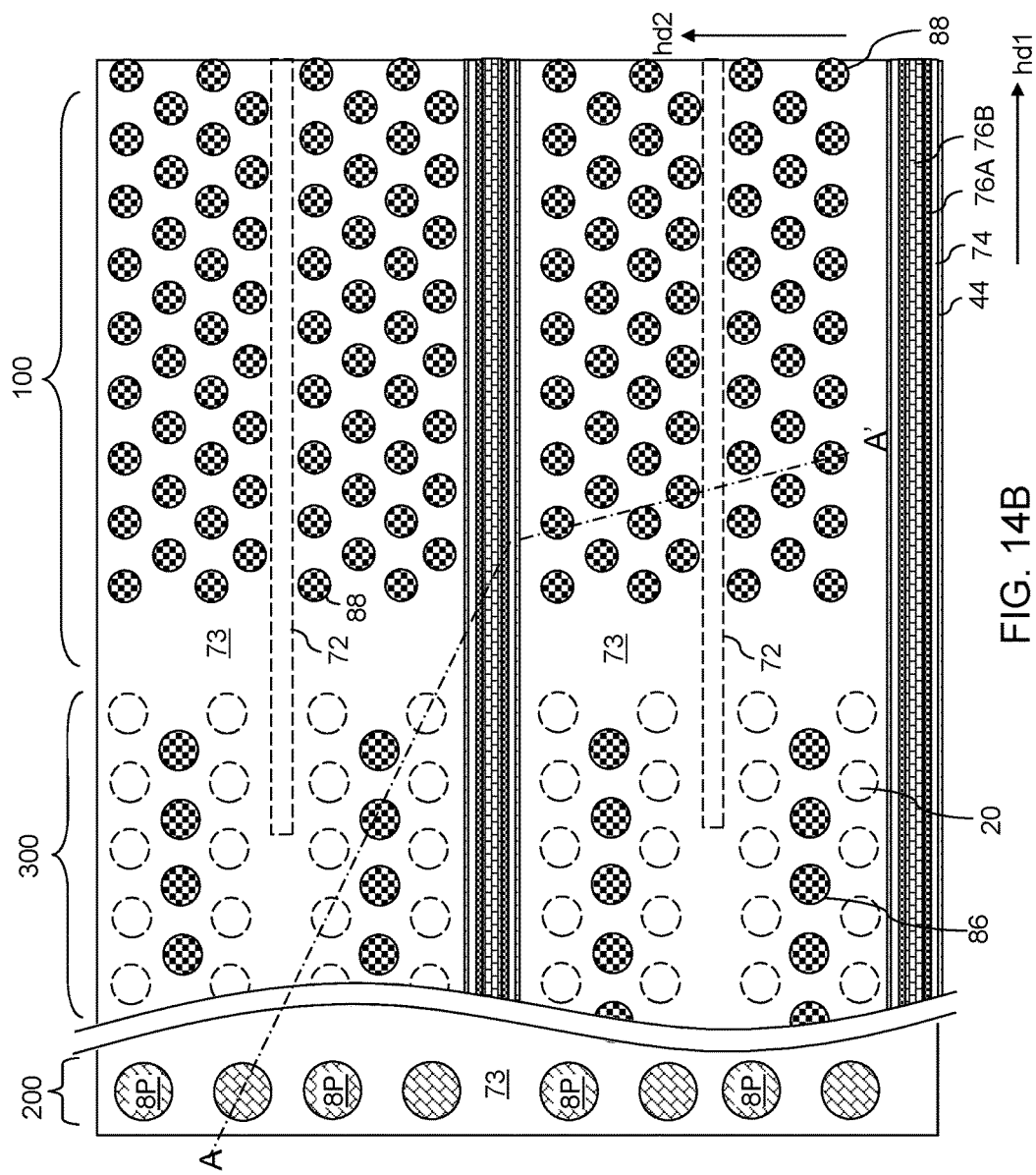
FIG. 14B is a top-down view of the exemplary structure of FIG. 14A. The vertical plane A-A' is the plane of the schematic vertical cross-sectional view of FIG. 14A.

Referring to FIGS. 14A and 14B, additional contact via structures (88, 86, 8P) can be formed through the contact level dielectric layer 73, and optionally through the retro-stepped dielectric material portion 65. For example, drain contact via structures 88 can be formed through the contact level dielectric layer 73 on each drain region 63. Word line contact via structures 86 can be formed on the electrically conductive layers 46 through the contact level dielectric layer 73, and through the retro-stepped dielectric material portion 65. Peripheral device contact via structures 8P can be formed through the retro-stepped dielectric material portion 65 directly on respective nodes of the peripheral devices.

Referring to all drawings of the present disclosure and according to various embodiments of the present disclosure, a three-dimensional memory device is provided, which comprises: an alternating stack of insulating layers 32 and electrically conductive layers 46 located over a substrate (9, 10), and a memory stack structure 55 extending through the alternating stack (32, 46), wherein the memory stack structure 55 comprises a memory film 50 and a vertical semiconductor channel 60 contacting an inner sidewall of the memory film 50 and comprising germanium at an atomic concentration greater than 50%.

In one embodiment, the three-dimensional memory device further comprises a semiconductor oxide core 62 laterally surrounded by the vertical semiconductor channel 60, wherein the semiconductor oxide core 62 comprises a silicon-germanium oxide material having a radial concentration gradient of atomic concentration of silicon.

In one embodiment, the semiconductor oxide core 62 has a pillar shape with a vertical axis VA passing through a geometrical center GC of the semiconductor oxide core 62, and the atomic concentration of silicon atoms decreases with a radial distance from the vertical axis VA. In one embodiment, the ratio of the atomic concentration of silicon to the atomic concentration of germanium is greater than 10 at the geometrical center, and is less than 0.5 at an interface between the semiconductor oxide core 62 and the vertical semiconductor channel 60.

In one embodiment, the semiconductor oxide core 62 consists essentially of silicon atoms, germanium atoms, oxygen atoms, and dopant atoms selected from n-type dopant atoms and p-type dopant atoms and having an atomic concentration less than 0.5%.

In one embodiment, the three-dimensional memory device further comprises a silicon-germanium alloy region (11B, 102) located below the memory film 50, wherein the silicon-germanium alloy region has a vertical germanium concentration gradient such that a germanium concentration increases with a vertical distance from an interface with the memory film.

In one embodiment shown in FIG. 6H, the pedestal channel portion 11' is omitted and the silicon-germanium alloy region 102 is located in the semiconductor material layer 10. In other embodiment shown in FIGS. 5F-5J, the three-dimensional memory device can comprise a semiconductor material layer 10 located within an upper portion of the substrate (9, 10), and a pedestal channel portion 11' underlying the memory film 50 and contacting a bottom end of the vertical semiconductor channel 60 and containing the silicon-germanium alloy region 11B.

In one embodiment, the semiconductor material layer 10 comprises an electrically doped silicon material and is substantially free of germanium, and a bottom portion of the vertical semiconductor channel 60 extends through an opening in an annular bottom portion of the memory film 50 and contacts the pedestal channel portion 11'.

In one embodiment, the semiconductor oxide core 62 contacts the pedestal channel portion 11', and an outer sidewall of the pedestal channel portion 11' is vertically coincident with an outer sidewall of the memory film 50. In one embodiment, the three-dimensional memory device further comprises a backside blocking dielectric layer 44 disposed between each neighboring pair of an electrically conductive layer 46 and an insulating layer 32 and laterally surrounding the memory film 50 at each level of the electrically conductive layers 46, and a tubular dielectric spacer 116 laterally surrounding the pedestal channel portion 11' at a level of a bottommost one of the electrically conductive layers 46. In one embodiment, the vertical semiconductor channel 60 includes germanium atoms at an atomic concentration greater than 99%.

In one embodiment, the alternating stack (32, 46) comprises a terrace region in which each electrically conductive layer 46 other than a topmost electrically conductive layer 46 within the alternating stack (32, 46) laterally extends farther than any overlying electrically conductive layer 46 within the alternating stack (32, 46). The terrace region includes stepped surfaces of the alternating stack (32, 46) that continuously extend from a bottommost layer within the alternating stack (32, 46) to a topmost layer within the alternating stack (32, 46). A retro-stepped dielectric material portion 65 overlies the stepped surfaces in the terrace region. Support pillar structures 20 extend through the stepped surfaces and through the retro-stepped dielectric material portion 65 and portions of the alternating stack (32, 46) that underlie the stepped surfaces.

In one embodiment, the three-dimensional memory device comprises a monolithic three-dimensional NAND memory device, the electrically conductive layers 46 comprise, or are electrically connected to, a respective word line of the monolithic three-dimensional NAND memory device, and the substrate (9, 10) comprises a silicon substrate. The monolithic three-dimensional NAND memory device comprises an array of monolithic three-dimensional NAND strings over the silicon substrate. At least one memory cell in a first device level of the array of monolithic three-dimensional NAND strings is located over another memory cell in a second device level of the array of monolithic three-dimensional NAND strings. The silicon substrate contains an integrated circuit comprising a driver circuit for the memory device located thereon. The electrically conductive layers 46 comprise a plurality of control gate electrodes having a strip shape extending substantially parallel to the top surface of the substrate (9, 10). The plurality of control gate electrodes comprise at least a first control gate electrode located in the first device level and a second control gate electrode located in the second device level. The array of monolithic three-dimensional NAND strings comprises a plurality of semiconductor channels 60, wherein at least one end portion of each of the plurality of semiconductor channels 60 extends substantially perpendicular to a top surface of the substrate (9, 10), and one of the plurality of semiconductor channels includes the vertical semiconductor channel 60, and comprises a plurality of charge storage elements, each charge storage element located adjacent to a respective one of the plurality of semiconductor channels 60.

The high germanium content, such as greater than 50% and/or greater than 99% in atomic concentration of germanium, in combination with smooth inner and outer surfaces thereof provides high mobility to charge carriers (which can be electrons or holes) in the vertical semiconductor channels 60 of the three-dimensional memory device, thereby increasing the operational speed or on-current of the vertical semiconductor channels of the three-dimensional memory device.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of forming a three-dimensional memory device, comprising:
   forming an alternating stack of insulating layers and sacrificial material layers over a substrate, wherein the sacrificial material layers are formed as, or are subsequently replaced with, electrically conductive layers;
   forming a memory opening through the alternating stack;
   forming a memory film in the memory opening, the memory film comprising a blocking dielectric layer, a charge storage layer, and a tunneling dielectric layer;
   depositing a silicon-germanium alloy layer including germanium at an atomic concentration less than 25% within the memory opening over the tunneling dielectric layer; and
   performing an oxidation process on the silicon-germanium alloy layer to form a vertical semiconductor channel in an unoxidized remaining material portion of the silicon-germanium alloy layer, wherein the vertical semiconductor channel comprises germanium at an atomic concentration greater than 50%.

2. The method of claim 1, further comprising forming a silicon cap layer on the silicon-germanium alloy layer prior to performing the oxidation process.

3. The method of claim 2, wherein the oxidation process converts the silicon cap layer into a semiconductor oxide layer, such that silicon atoms are preferentially incorporated into the semiconductor oxide layer and germanium atoms are preferentially provided into the unoxidized remaining material portion of the silicon-germanium alloy layer.

4. The method of claim 3, wherein the semiconductor oxide layer forms a silicon oxide or silicon-germanium oxide core which completely fills a remaining portion of the memory opening and has a pillar shape with a vertical axis passing through a geometrical center of the core.

5. The method of claim 4, wherein the semiconductor oxide layer forms the silicon-germanium oxide core in which an atomic concentration of silicon atoms decreases with a radial distance from the vertical axis.

6. The method of claim 4, wherein:
   the oxidation process comprises a thermal oxidation process;
   the thermal oxidation process is performed in multiple steps with different oxidation temperatures that decrease with progression of the thermal oxidation process; and
   an oxidation temperature of a last step of the thermal oxidation process is in a range from 800 degrees Celsius to 937 degrees Celsius.

7. The method of claim 1, further comprising depositing an amorphous silicon or polysilicon seed layer in the memory opening, wherein the silicon-germanium alloy layer is formed on the seed layer.

8. The method of claim 1, further comprising:
   forming a pedestal channel portion at a bottom portion of the memory opening; and
   forming an opening through a bottom portion of the memory film, wherein the silicon-germanium alloy layer is formed on the pedestal channel portion.

9. The method of claim 8, wherein:
   the pedestal channel portion is substantially free of germanium upon formation and prior to formation of the memory film; and
   germanium atoms diffuse from the silicon-germanium alloy layer into the pedestal channel portion during the oxidation process to provide a vertical germanium concentration gradient such that a germanium concentration decreases within the pedestal channel portion with a distance from an interface between the silicon-germanium oxide material and the pedestal channel portion.

10. The method of claim 1, wherein the vertical semiconductor channel includes germanium atoms at an atomic concentration greater than 99%.

* * * * *